US011387434B2

(12) United States Patent
Magno et al.

(10) Patent No.: US 11,387,434 B2
(45) Date of Patent: *Jul. 12, 2022

(54) BAND EDGE EMISSION ENHANCED ORGANIC LIGHT EMITTING DIODE WITH A LOCALIZED EMITTER

(71) Applicant: RED BANK TECHNOLOGIES LLC, Red Bank, NJ (US)

(72) Inventors: John N. Magno, St. James, NY (US); Gene C. Koch, Toms River, NJ (US)

(73) Assignee: Red Bank Technologies LLC, Red Bank, NJ (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/885,401

(22) Filed: May 28, 2020

(65) Prior Publication Data
US 2020/0295305 A1 Sep. 17, 2020

Related U.S. Application Data

(63) Continuation of application No. 15/738,214, filed as application No. PCT/US2016/038479 on Jun. 21, 2016.

(Continued)

(51) Int. Cl.
*H01L 51/52* (2006.01)
*G02B 1/02* (2006.01)
(Continued)

(52) U.S. Cl.
CPC .......... *H01L 51/5265* (2013.01); *C30B 23/00* (2013.01); *C30B 29/16* (2013.01);
(Continued)

(58) Field of Classification Search
CPC ............ H01L 51/5265; H01L 51/5221; H01L 51/5275; H01L 51/5012; H01L 2251/533;
(Continued)

(56) References Cited

U.S. PATENT DOCUMENTS 7,335,921 B2  2/2008  Magno et al.
8,304,796 B2 * 11/2012  Fukuda ............... H01L 51/5265
                                                257/98
(Continued)

FOREIGN PATENT DOCUMENTS

EP   1587186   7/2008
GB   2356713   5/2001
(Continued)

OTHER PUBLICATIONS

Search Report for corresponding European Patent Application No. 16815128.0 dated Jan. 31, 2019.
(Continued)

Primary Examiner — Vu A Vu
(74) Attorney, Agent, or Firm — Reed Smith LLP

(57) ABSTRACT

A light emitting photonic crystal having an organic light emitting diode and methods of making the same are disclosed. An organic light emitting diode disposed within a photonic structure having a band-gap, or stop-band, allows the photonic structure to emit light at wavelengths occurring at the edges of the band-gap. Photonic crystal structures that provide this function may include materials having a refractive index that varies.

3 Claims, 11 Drawing Sheets

Related U.S. Application Data

(60) Provisional application No. 62/183,771, filed on Jun. 24, 2015.

(51) Int. Cl.
  *C30B 29/54* (2006.01)
  *H01L 51/50* (2006.01)
  *C30B 23/00* (2006.01)
  *C30B 29/16* (2006.01)
  *H01L 51/00* (2006.01)
  *H01L 51/56* (2006.01)

(52) U.S. Cl.
  CPC ............... *C30B 29/54* (2013.01); *G02B 1/02* (2013.01); *H01L 51/5012* (2013.01); *H01L 51/5221* (2013.01); *H01L 51/5275* (2013.01); H01L 51/006 (2013.01); H01L 51/0058 (2013.01); H01L 51/0072 (2013.01); H01L 51/0085 (2013.01); H01L 51/5016 (2013.01); *H01L 51/56* (2013.01); *H01L 2251/301* (2013.01); *H01L 2251/303* (2013.01); *H01L 2251/533* (2013.01); *H01L 2251/558* (2013.01)

(58) Field of Classification Search
  CPC ............... H01L 51/0058; H01L 51/006; H01L 2251/558; H01L 51/0072; H01L 2251/303; H01L 51/56; H01L 2251/301; H01L 51/0085; H01L 51/5016; G02B 1/02; C30B 29/54
  USPC .......................................................... 257/40
  See application file for complete search history.

(56) References Cited

U.S. PATENT DOCUMENTS

| | | |
|---|---|---|
| 8,860,005 B1 | 10/2014 | Bedell et al. |
| 9,129,552 B2 | 9/2015 | Magno et al. |
| 2002/0003827 A1 | 1/2002 | Genack et al. |
| 2004/0069995 A1 | 4/2004 | Magno et al. |
| 2007/0177388 A1 | 8/2007 | Wang |
| 2010/0283068 A1 | 11/2010 | Buckley et al. |
| 2013/0193416 A1 | 8/2013 | Shin |
| 2014/0001450 A1 | 1/2014 | Shinotsuka et al. |

FOREIGN PATENT DOCUMENTS

| | | |
|---|---|---|
| JP | 2003151761 | 5/2003 |
| JP | 2005071919 | 3/2005 |
| JP | 2006505092 | 2/2006 |
| WO | 2012035083 | 3/2012 |

OTHER PUBLICATIONS

Office Action for corresponding Japanese Patent Application No. 2018519681 dated May 11, 2020.

\* cited by examiner

BAND EDGE EMISSION ENHANCED ORGANIC LIGHT EMITTING DIODE WITH A LOCALIZED EMITTER

CROSS-REFERENCE TO RELATED APPLICATION

This application is a continuation of, and claims the benefit under 35 U.S.C. § 120 of the earlier filing date of, copending U.S. Ser. No. 15/738,214 filed on Dec. 20, 2017, which is the 371 National Stage of International Application No. PCT/US2016/38479, filed Jun. 21, 2016, which was published as International Publication No. WO 2016/209797, and which claims the benefit under 35 U.S.C. § 119(e) of the earlier filing date of U.S. Provisional Patent Application No. 62/183,771 filed on Jun. 24, 2015, the disclosure of which is incorporated by reference herein.

BACKGROUND

The following description relates to an improved light emitting device and methods of manufacturing the same.

Organic light-emitting diodes ("OLEDs") are optoelectronic devices made by placing a layer of organic material between two electrodes, which when a voltage potential is applied to the electrodes and current is injected through the organic material, visible light is emitted from the organic material or emissive material. Due to the high power efficiency, low cost of manufacture, lightweight and durability, OLEDs are often used to create visual displays for portable and non-portable devices as well as consumer lighting.

OLEDs are rapidly replacing liquid crystal display ("LCD") devices in the market for lighting and display devices. This is driven by advantages in viewing experience, size, weight, and simplicity. In U.S. Pat. Nos. 7,335,921, 9,129,552 and U.S. Patent Application Publication No. 2004/0069995, light emitting diode ("LED") devices and particularly OLEDs are described in which one or more feedback means are integrated with the light emitting diode structures so as to provide enhanced levels of light emission and energy efficiency by exploiting phenomenon of stimulated emission. These devices are collectively referred to as feedback enhanced organic light emitting diodes (FE-OLEDs). U.S. Pat. No. 9,129,552 application describes methods of utilizing FE-OLEDs in display devices. Generally, FE-OLED architectures are useful for nonlaser and laser applications. Since light is emitted by a FE-OLED through emission stimulated by feedback light, such emitted light is predominantly collimated and emitted normal or near normal to the surface of the device.

A great advantage of non-lasing FE-OLEDs is that the energy efficiency of the devices is greatly enhanced vis-a-vis conventional OLEDs. The majority of light produced in conventional OLEDs never emerges from these devices because it is emitted at angles far enough from the normal to the device surface that it is trapped in the device by internal reflections. Since essentially all the light emitted by FE-OLEDs is emitted at near normal angles, nearly all the light that is produced within the devices escapes. This can result in a three-fold increase in energy efficiency.

A distinguishing feature of FE-OLEDs, is a resonant cavity formed between two feedback means, for example two photonic crystals. Within this resonant cavity a layer of emitter material is disposed which emits photons as a result of stimulated emission induced by photons that are localized within the resonant cavity by the opposing feedback means. In certain of these embodiments a complete OLED is formed within the resonant cavity. By tailoring the feedback means to redirect the light emitted by the emitter material, or emitter, back towards and through the emitter material, the emitted light is localized within the resonant cavity—that is, it is cycled back and forth between the two feedback means, repeatedly passing through the emitter material increasing the probability of inducing further stimulated emission in the emitter material. By tailoring the location of the emitter between the feedback means in order to localize the peak optical power of the light at the emitter material in this way, the efficiency of light emission is enhanced and resulting devices are an improvement over known OLEDs. As a result, the amount of optical power output from the emitter material within the resonant cavity is highly efficient in terms of the electrical power applied to the device. Furthermore, because the stimulated emission occurs normal to the resonant cavity interface, and therefore normal to the FE-OLED emission surface, very little light is lost by emission into the plane of the emission material or to total internal refraction at the interface boundaries. Methods for the fabricating feedback means are described in U.S. Patent Application Publication No. 2004/0069995 (the "'995 Application"), which is incorporated herein by reference in its entirety.

A drawback in known FE-OLED devices is their difficulty to manufacture on any scale due to demanding physical constraints on device design. While FE-OLEDs provide significant improvements over prior art LEDs and OLEDs, a light emitting device is desired which will increase the optical efficiency and provide the versatility and benefits of OLEDs while simplifying the device design process and allowing high yield manufacturing processes, while reducing heat produced, consuming less power overall, enabling tuning across a broad range of emission frequencies, and lasting longer than presently available OLED and LED light sources.

DETAILED DESCRIPTION OF THE INVENTION

A photonic crystal is a material having a structure with periodic variation in the value of its refractive index which gives rise to a band-gap, or stop-band. This is referred to as a photonic crystal exhibiting a photonic band-gap, or a photonic crystal having a band-gap. A photonic band-gap or stop-band is a range of wavelengths in the transmission spectrum of a medium in which electromagnetic radiation (EMR) cannot propagate through the structure in the direction of refractive index variation, that is to say, light cannot propagate in that direction. Photonic crystals can be designed such that the refractive index variation and thus the stop-band is in a single direction or dimension, i.e. a distributed Bragg reflector ("DBR"), or in two or three dimensions, as disclosed in among other places the '941 Application. In describing a stop-band in terms of wave propagation modes, a photonic crystal is a structure in which electromagnetic wave modes over a band of wavelengths are not allowed. The range of wavelengths prohibited from propagating through the photonic crystal is dictated by the periodicity of the refractive index variation in the photonic crystal structure. This band-gap, or stop-band, is the electromagnetic analog to a crystalline atomic lattice acting on an electron wavefunction within a semiconductor to produce the band-gaps of solid-state physics. That is, within the photonic crystal particular solutions to the EMR wave equation are prohibited within a certain range of wavelengths. This range of wavelengths, within which no solutions to the wave equation exist, is the band-gap or stop-band. The stop-band for a particular structure is tailored to prohibit light having a range of wavelengths from propagating along a transmission axis by adjusting the periodicity of the photonic crystal itself in the direction of the transmission axis. In the case of a DBR this can be accomplished by adjusting the optical thickness of its constituent layers.

Photonic crystals can be created in a number of ways, for example the '995 Application and U.S. Pat. No. 7,335,921 (the "'921 Patent") disclose a number of alternative forms photonic crystals can take. The '921 is herein incorporated by reference in its entirety. Photonic crystals with stop-bands can be produced utilizing DBRs and, in addition, can be produced utilizing holographically recorded gratings, opals, inverse opals, aligned nematic liquid crystals, chiral liquid crystals, and potentially polymerized lyotropic liquid crystal structures.

Figure 1:
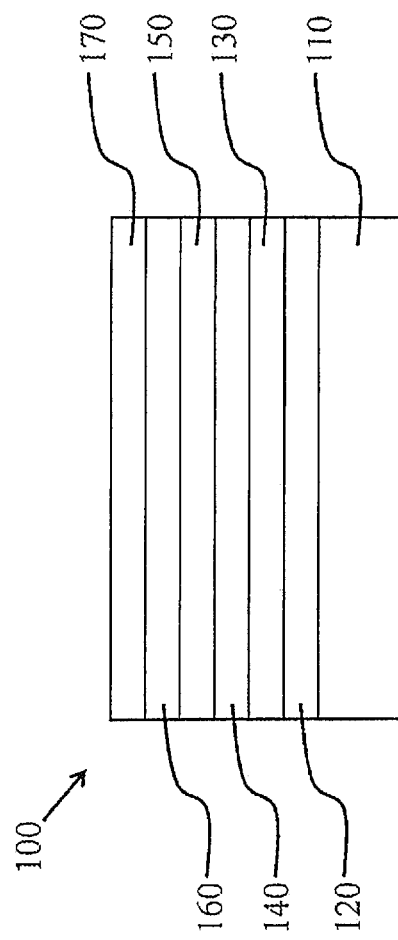
FIG. 1 illustrates the basic structure of an organic light emitting diode.

Conventional OLEDs, an example 100 of which is portrayed in FIG. 1, are generally comprised of a number of functional layers each of which serve to improve the functionality of the device. For example, the OLED 100 consists of a substrate 110, a transparent anode 120, a hole injection layer 130, a hole transporting layer 140, an emitter layer 150, an electron transporting layer 160, and a metal cathode 170. The device 100 functions as follows: when an electrical potential difference is applied between the anode and the cathode, positively charged holes are injected from the anode 120 into the hole injection layer 130. Under the influence of the imposed electric field the holes flow from the hole injection layer, through the hole transporting layer 140 and into the emitter layer 150. At the same time electrons are injected from the cathode 170 into the electron transporting layer 160. Under the influence of the imposed electric field the electrons flow from the electron transporting layer into the emitter layer 150. In the emitter layer the electrons and holes pair together on single organic molecules promoting the molecules into electronically excited states. These excited states (excitons) then collapse to emit photons, or in other words to produce light. It will be appreciated that methods and apparatus for applying a potential between the anode and cathode of an OLED for a particular application are known.

In OLEDs the hole injection layers 130, the hole transporting layers 140, the emitter layers 150, and the electron transporting layers 160 are all composed of organic materials. A typical device may also contain additional layers such as electron injection layers, hole blocking layers and electron blocking layers. Generally, the organic materials for forming the various layers of an OLED have quite low charge carrier (electron or hole) mobilities. As a result, if these layers are at all thick, very large impedance losses will occur in the OLEDs causing the devices to run at very elevated voltages and suffer thermal failure leading to a short device lifetime.

FE-OLED, also known as defect-mode devices, exploit the phenomenon of stimulated emission by creating a high photon density within a cavity, or defect, between two feedback means, where the cavity contains an emissive material, for example the emitter of an OLED. The feedback means may be two photonic crystals, wherein the stop-bands are tailored to reflect light emitted by the emissive material back towards the emissive material. Alternatively, the feedback means may be a single photonic crystal opposite a metallic reflector or mirror, or, the feedback means be two holographically recorded materials gratings. As described above, FE-OLEDs provide many improvements over traditional light emitting devices used in displays; however FE-OLEDs suffer for being difficult to mass produce.

Figure 2:
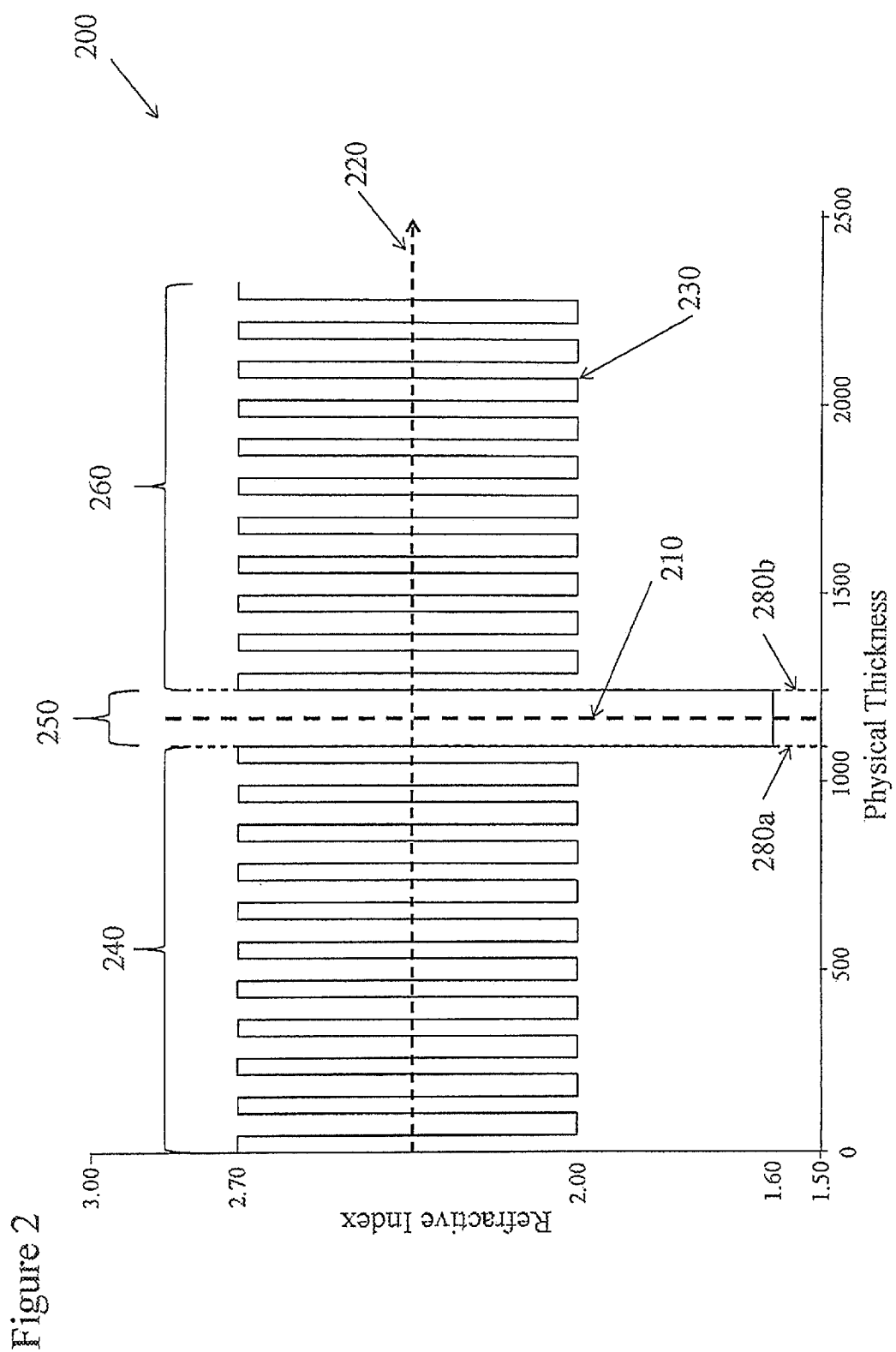
FIG. 2 illustrates index of refraction profile of a simple model defect mode device.
Figure 3:
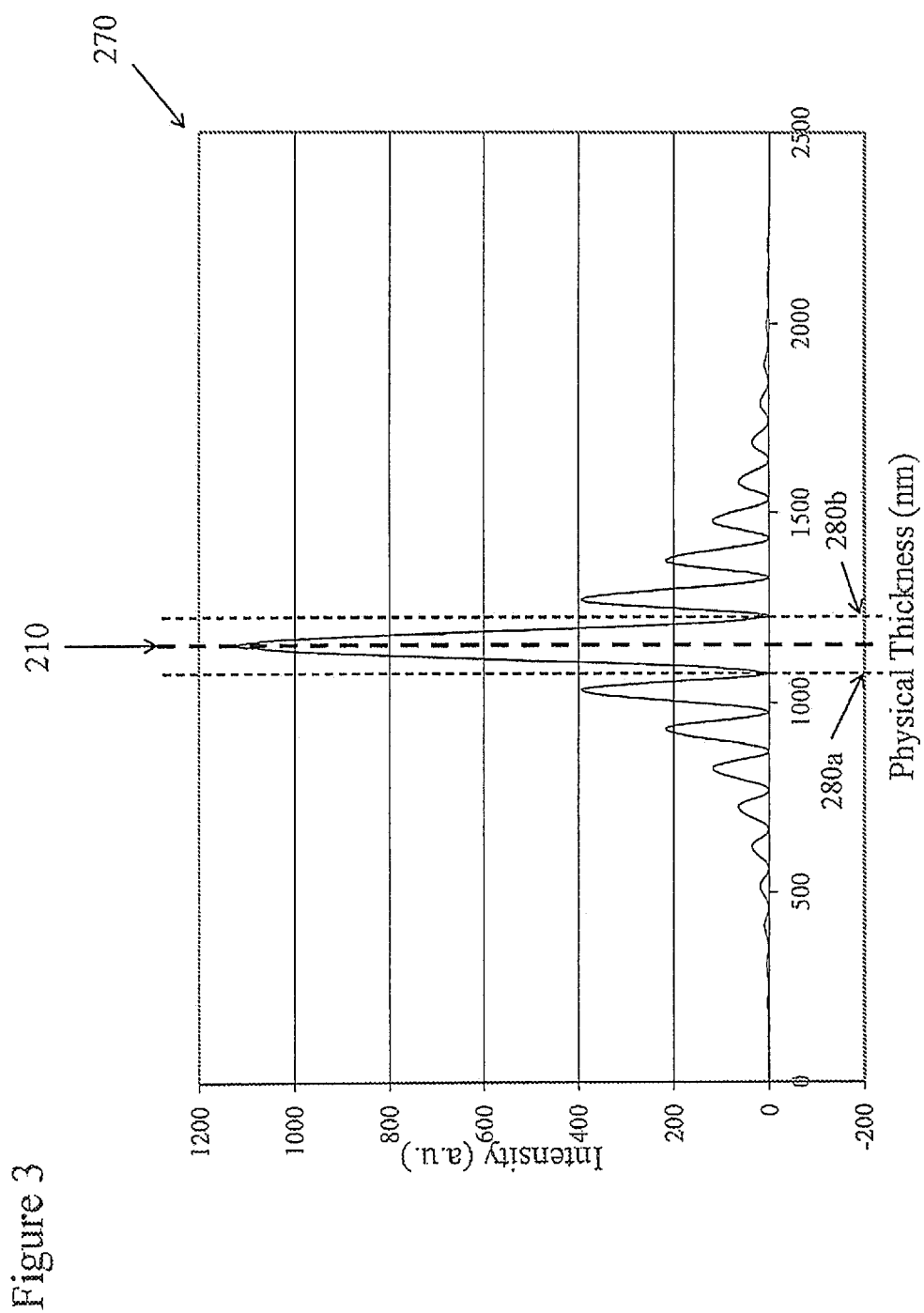
FIG. 3 illustrates the optical intensity of the light distributed through a defect mode device overlaying the defect mode device resonant cavity.

To illustrate the difficulties, consider, a simplified model (not shown) of such an FE-OLED which consists of two DBR's separated by a cavity, such that the DBR surfaces are parallel to each other. Also, consider FIG. 2 illustrating a refractive index profile 200 experienced by light travelling through such a model FE-OLED device parallel to transmission axis 220; and, consider FIG. 3 illustrating the resulting light intensity distribution 270 within the device. Within the cavity, having a refractive index profile 250, of such a device, an OLED (not shown), or portions thereof may be formed. Ideally the OLED is formed such that the emitter material of the OLED is precisely aligned along a plane 210 within the cavity, plane 210 ideally experiencing maximum light intensity in order to maximize further stimulated emission within the emitter material. In such a device, light travelling through the device will experience a changing index of refraction along a transmission axis 220. This changing index of refraction will be periodic passing through the first portion of the photonic crystal, corresponding to refractive index profile 240, or through the second portion of the photonic crystal, corresponding to refractive index profile 260, but this periodicity will be interrupted by the cavity, which will cause a phase slip. The model device consists of a stack of 43 layers (not shown), giving rise to the refractive index profile 230. The first section of the profile 240 corresponds to a stack of eleven 43.98 nm thick layers of a transparent material having a refractive index of 2.70, and interposed between these layers are ten layers of a transparent material each 59.38 nm thick having a refractive index of 2.00. The layers alternate from high to low refractive index through the stack and each of the layers has a physical thickness such that its optical thickness (refractive index multiplied by physical thickness) is equal to 118.8 nm, or a quarter wave thickness for light having wavelength of 475 nm. On top of the last of these 21 layers is a 148.44 nm thick layer 250 of a material having a refractive index of 1.60. On top of this layer is a second feedback means 260 consisting of 21 more layers identical to the first 21 in the stack. In this model light emission is assumed to occur in a plane 210 at the center of the central 148.44 nm thick layer. In summary, FE-OLEDs are embodied as two feedback means, e.g. two photonic crystals (e.g. 240 and 260) with the emitter layer of an OLED located in a cavity 250 between the two feedback means.

FIG. 3 shows a plot 270 of the modeled light intensity distribution through the FE-OLED, described above, along transmission axis 220 of FIG. 2, when the OLED emits light having a wavelength of 475 nm into the stack. It can be seen that there is a strongly peaked maximum or anti-node of light intensity at the center of the central 148.44 nm thick layer, corresponding to plane 210, with nodes of zero intensity at the boundaries 280a and 280b of this central layer. Thus the two twenty-one layer feedback structures are reflecting light back into the cavity formed by the 148.44 nm thick central layer.

The operating principle of FE-OLEDs, is that the high photon density within the cavity results in very efficient stimulation of light emission from the emitter in the cavity as long as the emitter is centered precisely on plane 210. Difficulties with devices of this type arise because the maximum light intensity occurs in a very narrow region within the cavity, and light intensity rapidly drops off moving away from plane 210. In the modeled example shown in FIG. 2 and FIG. 3 this plane is centered in the cavity between the feedback layers. However, in this simplified model the material in the cavity has a uniform refractive index.

In practice, generally this is not the case, because multiple OLED functional layers, comprising different materials with different refractive indices, lie within the cavity 250 and this results in a different, more complicated, distribution of light intensity. The thickness and location of the layers that make up the OLED are largely dictated by electronic considerations and thus it may not be possible to locate an emitter layer at the plane 210 where maximum light intensity occurs. If it is possible, registering the emitter layer to occur in the location of maximum light intensity 210 is a difficult task. A further issue is that the strength of the light intensity localization in the cavity of these devices is very sensitive to the cavity thickness and could vary considerably from device to device if the OLED's organic layer thicknesses are not held to very tight tolerances. Referring back to FIG. 2 and the device upon which the profile 230 is modelled, because a cavity is necessary for light localization, the resonant cavity 250 and thus the emitter layer, and the functional and non-functional layers surrounding the emitter layer in various embodiments, do not (and cannot) function as part of the photonic crystal itself. Thus, defect-mode devices are embodied as two feedback means, e.g. with index of refraction profiles described by 240 and 260, e.g. two photonic crystals, with the emitter layer of an OLED located in a cavity 250 between the two feedback means.

In summary, up until the present time the commercial potential of FE-OLEDs has not been able to be realized because of yield issues having to do with maintaining proper layer thicknesses, the difficulty in spatially registering the two photonic crystal structures required one to the other, and the difficulty in registering the emitter layer at the peak optical power of the light distribution in the device; which peak optical power is itself dependent on the interplay between the period of the refractive index in each feedback means, the thickness of the cavity, the special registration of the two feedback means and the variations in index of refraction that arise in practice within the cavity caused by the presence of the OLED layers. Given the difficulty in manufacturing FE-OLED type devices, it is similarly difficult to modify the manufacturing processes to provide multiple colors of light (i.e. the desired output spectrum), because modifying the periodicity of the index of refraction variation in order to shift the stopband also requires modification of the size of the resonant optical cavity between the two devices, reregistering the phase of the two feedback means on either side of the resonant cavity and also reregistering the location of the emitter layer within the resonant optical cavity such that it falls on the peak optical power 210.

A second type of device enhancement based on stimulated emissions, which exploits phenomena manifested at the EMR modes found at the spectral edges of a photonic stop-band, is disclosed. This second type of device is referred to as a band-edge emission device. A band edge emission arises when light is emitted inside a photonic crystal structure. When an emitter material is disposed within a photonic crystal and excited, for example by application of a voltage (electric pumping) or by optically pumping, to emit light having a band of wavelengths some of which are overlapped by the stop-band, light is prohibited from propagating through the photonic structure in that band. Instead light having wavelengths at the edge of the stop-band or band-gap will be emitted into the photonic crystal and then emerge from a surface or surfaces of the photonic crystal structure. In various embodiments of this type of device an emitter material is disposed entirely within one layer of a DBR constituting a photonic crystal.

It is tempting to assume that if an emitter material is introduced within a photonic crystal, wherein some portion of the emission spectrum of the emitter material is overlapped by the photonic stop-band of the photonic crystal, that the emission modes or states that would exist in free space, but for the photonic crystal, are destroyed. However, such emission modes are only expelled from, or prohibited from existing within, the photonic crystal and instead of being destroyed can be envisioned as being 'stacked-up' at the edges of the stop-band. In terms of density of states, the number of allowable wave propagation states or modes per interval of frequency in the EMR spectrum increases substantially at the edges of the stop-band.

Figure 4:
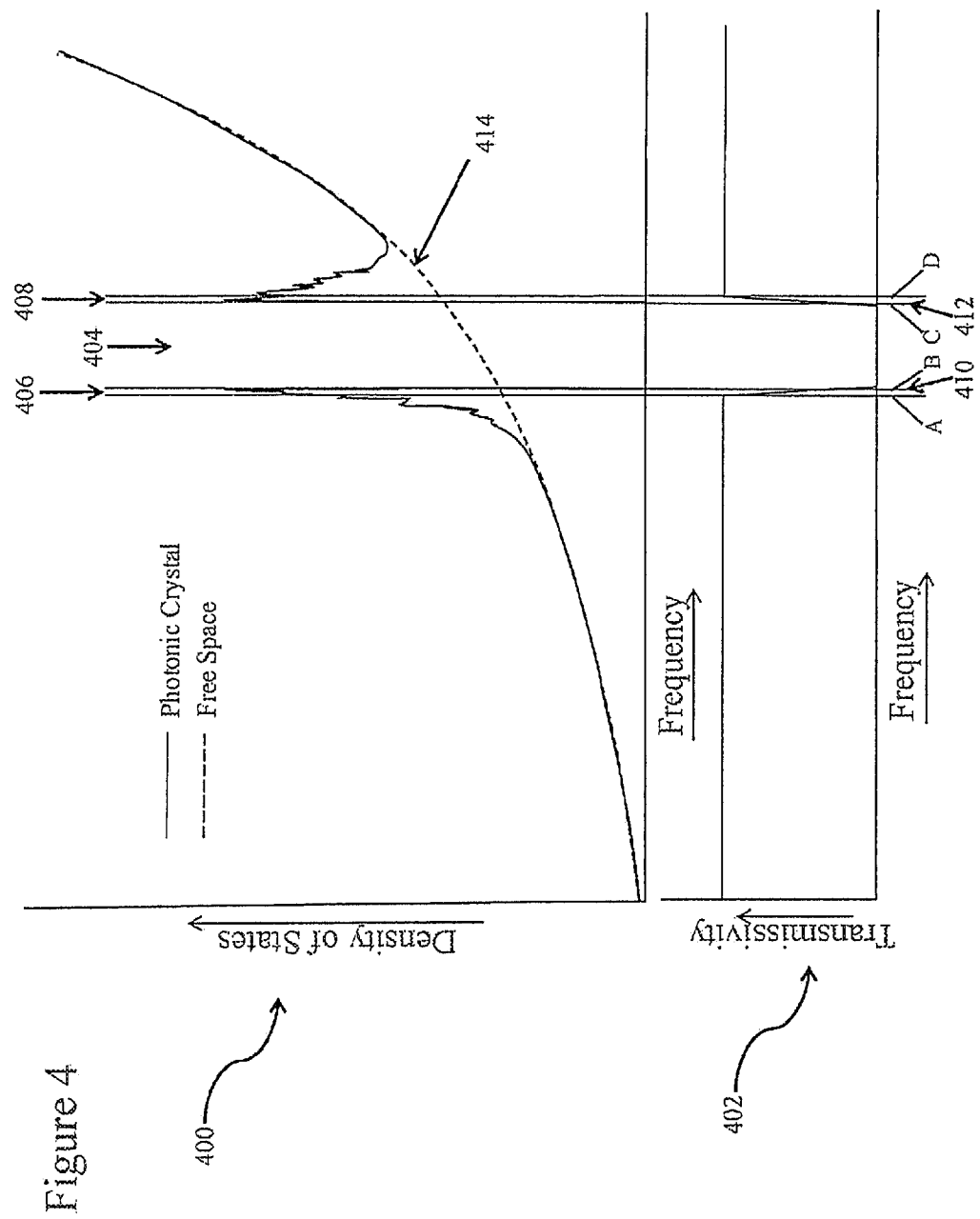
FIG. 4 illustrates the density of states spectrum in a medium having a photonic refractive index profile and corresponding transmissivity spectrum.

As described above, spontaneous emission is suppressed for wavelengths of light within a photonic band-gap. This is because the probability that an excited state atom is de-excited through either spontaneous emission or stimulated emission is proportional to the density of photon states, which vanishes throughout the photonic band-gap for given modes. For an illustrative example, FIG. 4 illustrates the density of states spectrum 400 of an emission medium disposed within a photonic crystal, and the transmission spectrum 402 for a photonic crystal having a stop-band or band-gap 404 in which the density of states goes to zero and so prohibits the propagation of modes having frequencies falling within the band-gap 404, i.e. between frequencies B and C. Overlaying this spectrum is the free space density of states spectrum 414 of the emissive material existing outside the photonic crystal. In terms of EMR frequency, frequency B forms the lower boundary 410 of stop-band 404 and frequency C forms the upper bound 412 of stop-band 404. Because the amount of light that an emitting molecule will emit into its surroundings depends on the density of states available to propagate the light, an emitter molecule emitting into a surrounding photonic crystal having a density of states spectrum 400 will emit considerably more light photons at frequencies falling in the lower range 406, between frequencies A and B, or in the upper range 408, between frequencies C and D. Additionally, photonic crystals have the benefit of being at least partially transparent to band-edge frequencies as is seen by the transmissivity spectrum 402 showing decreasing transmissivity through the lower region 406 and then increasing transmissivity through the upper region 408 as the frequency increases, thus allowing band-edge emission to escape the device.

Referring to FIG. 4, when EMR modes having frequencies falling within the stop-band 404 are induced by an emitter material within a photonic crystal having stop-band 404 the density of states for EMR within stop-band 404 are suppressed and tend towards zero, while the density of states for modes of light having frequencies approaching the lower bound 410 from the left, or approaching the upper bound 412 from the right, increases substantially, in particular for modes of light having frequencies in the lower range 406, between frequencies A and B, and in the upper range 408, between frequencies C and D. These emissions in lower range 406 and upper range 408 are known as band-edge emissions. As can be seen from FIG. 4 there is an increased density of states, in relation to free space (e.g. 414), extending beyond ranges A-B and C-D, thus the ranges A-B and C-D could be altered outwardly from the stop-band and still be described as encompassing band-edge emissions.

A band-edge emission having a frequency spectrum centered on a frequency $v_{AB}$ in lower range 406 corresponds to EMR having a wavelength spectrum centered on wavelength $\lambda_{AB}=(c/v_{AB})$ which corresponds to modes of light having wavenumber $k_{AB}=(2\pi/\lambda_{AB})$; and similarly a band-edge emission having frequency spectrum centered on $v_{CD}$ in upper range 408 corresponds to EMR having a wavelength spectrum centered on $\lambda_{CD}=(c/v_{CD})$ which corresponds to modes of light having wavenumbers $k_{CD}=(2\pi/\lambda_{CD})$. A band-edge emission spectrum centered on $v_{AB}$ then is comprised of photons having a statistical distribution of energy centered on $E_{AB}=hv_{AB}=h(c/\lambda_{AB})$, (h being Planck's constant). Light in these devices with a frequency $v_{AB}$ equivalent to wavelength $\lambda_{AB}$ will have a very large number of modes in the small band of wavenumbers centered on $k_{AB}$. Modes having the wavenumber $k_{AB}$ can have varying phases $\varphi$. Whereas, in FE-OLED devices the modes all have nodes locked onto the cavity edges, e.g. as in FIG. 3, and thus there is a single mode for each allowed wavenumber, in band edge devices, many modes with the same wavenumber are allowed and this means that the plot of photon density versus position through the device is smooth with no nodes, as discussed below. As a result variations in emitter layer position within a photonic crystal have little effect in a band edge device.

Because of the partial transmissivity of a photonic crystal to these band-edge modes, light emitted at these wavelengths builds up within the medium comprising the band-edge photonic crystal. The combination of the higher than normal level of photon emission at wavelengths adjacent to the stop-band combined with buildup of these photons within the medium due to internal reflections yields very high photon densities throughout the bulk of the photonic crystal medium. These high photon densities ensure further stimulated emission from essentially all of the excited state emitter molecules embedded within the photonic crystal. In a one-dimensional photonic crystal, the direction of propagation of stimulated emission photons is normal to the emission surface.

Until now solid state band-edge organic light emitting diodes (BE-OLEDs) have not seemed to be possible because of the spatial mismatch between the assumed distribution of photons in the photonic crystal structure and the much smaller volume occupied by the emitter material. It was accepted that without doping emitter material throughout the extent of the photonic crystal structure, as had been the case in previously produced band-edge lasers, the insufficient interaction of previously emitted light entrained in the photonic crystal with excited emitter molecules would preclude a useful and efficient light emitting device.

Surprisingly a new light emitting device containing an OLED embedded in a single thin layer within a single photonic crystal will function as a non-lasing band-edge emitting light emitting device while providing a substantial amount of emitted light. Moreover, such a device provides substantially increased efficiency over conventional LEDs, OLEDs and cavity type FE-OLEDs. Optical power output on the order of 300 lumens per watt has been achieved. This increased efficiency is realized while having the benefit of being simpler to produce and generating less heat. Disclosed devices additionally provide a very refined emission spectrum occurring predominantly within a relatively narrow range of frequencies occurring close to the band edge of the photonic stop-band of the photonic crystal. The manufacture of these devices also allows a designer to easily fine tune the output frequency (i.e. color of the emitted light) of the resulting device by varying only a single factor—the periodicity of the index of refraction.

This allows the fabrication of devices that emit highly saturated colors of selected wavelengths because of their relatively narrow emission spectrum. As a result, full-color, OLED displays fabricated with red, green, and blue pixels utilizing band-edge emission can replicate a wide gamut of colors across the CIE color space.

Enhancements and features of the present invention and methods of accomplishing the same may be understood more readily by reference to the following detailed description of example embodiments and the accompanying drawings. The present invention may, however, be embodied in many different forms and should not be construed as being limited to the embodiments set forth herein. Rather, these embodiments are provided so that this disclosure will be thorough and complete and will fully convey the concept of the invention to those skilled in the art, and the present invention will only be defined by the appended claims, and equivalents thereof. Thus, in some embodiments, known structures and devices are not shown in order not to obscure the description of the invention with unnecessary detail. Like numbers refer to like elements throughout. In the drawings, the thickness of layers and regions are exaggerated for clarity.

It will be understood that when an element or layer is referred to as being "on," or "connected to" another element or layer, it can be directly on or connected to the other element or layer or intervening elements or layers may be present. In contrast, when an element is referred to as being "directly on" or "directly connected to" another element or layer, there are no intervening elements or layers present. As used herein, the term "and/or" includes any and all combinations of one or more of the associated listed items. Expressions such as "at least one of," when preceding a list of elements, modify the entire list of elements and do not modify the individual elements of the list. Further, the use of "may" when describing embodiments of the present invention refers to "one or more embodiments of the present invention." When discussing thicknesses or lengths of physical components or portions of the inventive device embodiments in terms of a wavelength of light, the thickness is such that light passing through such a component experiences an equivalent optical thickness (i.e. refractive index times physical thickness). For example a physical length equal to an optical thickness of ¼ of the wavelength of emitted light in a medium having an index of refraction of 1.1 where the emitted light is 600 nm, would result in an optical thickness of 150 nm, or a physical thickness equal to the optical thickness divided by 1.1, thus a physical thickness of 136.36 nm. One of skill in the art will appreciate when such an equivalent thickness is necessitated by the function of the component being described and where thickness and optical thickness may be used interchangeably.

Spatially relative terms, such as "below," "beneath," "lower," "above," "upper," and the like, may be used herein for ease of description to describe one element or feature's relationship to another element(s) or feature(s) as illustrated in the drawings. It will be understood that the spatially relative terms are intended to encompass different orientations of the device in use or operation in addition to the orientation depicted in the drawings.

Embodiments described herein will be described referring to plan views and/or cross sectional views by way of ideal schematic views of the invention. Accordingly, the example views may be modified depending on manufacturing technologies and/or tolerances. Therefore, the embodiments of the invention are not limited to those shown in the views, but include modifications in configuration formed on the basis of manufacturing processes. Therefore, regions shown in the drawings have schematic properties, and shapes of regions shown in the drawings are examples of specific shapes of regions of elements and do not limit aspects of the invention In one embodiment the device disclosed herein may be a unitary photonic crystal having an emitter material disposed within the photonic crystal. In various embodiments the emitter material may be located in the emitter layer of an OLED. Also, in various embodiments, the unitary photonic crystal may be a DBR, and may consist of a series of layers of various materials having different indexes of refraction, arranged in such a way that light passing through the device experiences a substantially periodic index of refraction profile. The index of refraction profile may be a periodic square wave type function such as that shown in FIG. 5, or in other embodiments it may be a continuously varying substantially periodic index of refraction.

The OLED may be formed as a single thin layer. In the case where the photonic crystal is a DBR, the OLED may alternatively comprise a single layer or one or more of the alternating index layers. In a device of this type the emitter layer and the associated electric charge carrier transporting and electric charge carrier blocking layers generally found in OLEDs combine together to form one or more active layers or active zones. Alternatively the OLED components are contained within an inactive material having appropriate index of refraction, wherein the OLED components and the material together form an active layer or active zone. As used herein, active zone and active layer and active region are used synonymously and refer generally to any part of photonic crystal containing aspects or components which function as a an OLED, irrespective of its geometry, excepting that the index of refraction experienced by light passing through the photonic crystal in a particular direction experiences a substantially continuously varying periodic index of refraction that is substantially uninterrupted passing through the geometry containing the active region. As used herein, inactive material means any material that does not relate to the electrical functioning of the OLED device. The active region may comprise in part inactive material. In one embodiment, the photonic crystal comprises a DBR consisting of a stack of dielectric layers having an alternating index of refraction from one layer to the next (e.g. high, low, high, low, high, low, etc.) and the active layer or layers are $\lambda/4$ in optical thickness where $\lambda$ is a wavelength of the central frequency of the stop-band of the photonic crystal, and the index of refraction of the active layer containing emitter material is lower than the index of refraction of each adjacent layer. Alternatively, the index of refraction of the active zone, or layer, is higher than the index of refraction of each adjacent layer. In another embodiment there are two active zones adjacent to each other, one active layer having a higher index of refraction than the other. In another embodiment there are three active layers, one comprising an anode, one comprising an OLED minus its electrodes, and one comprising a cathode, wherein the anode layer and the cathode layer are each adjacent to the OLED layer. Additionally there may be additional active regions or zones or layers throughout the photonic crystal. In any case in which the photonic crystal is a DBR the pattern of alternating high and low refractive index layers or zones of $\lambda/4$ optical thickness characteristic of photonic crystals carries on through the entire device stack, including the active layer(s), thus forming a single photonic crystal structure that emits light at the band-edge when the anode and cathode are energized. More generally, the periodicity of the periodic index of refraction is substantially uninterrupted throughout the light emitting photonic crystal.

In these devices the interaction of the photons that build up in density in the photonic crystal structure with the thin (preferably $\lambda/4$ optical thickness or less) organic emitter material layer does not induce lasing, but does interact sufficiently to ensure that essentially all light emission is stimulated in nature. Thus the emission is particularly useful for display and lighting applications because the light emitted from a BE-OLED is speckle-free emission. Speckle-free emission is collimated light produced by stimulated emission that does not produce the well known speckle effect of visible laser light—that is the 'salt and pepper' effect created by the destructive interference of laser photons on a viewing surface.

The OLED contains an emitter material whose free space electroluminescence emission yields a significantly high radiance at the band-edge wavelengths, that is to say, a radiance that when measured normal to the device surface is preferably at least 25% and most preferably at least 50% of the radiance at the peak spectral electroluminescence for the material. In other words, the measured radiance of luminescence light emitted by the light emitting material utilized in the organic light emitting diode is greater than one-quarter of the peak radiance of the luminescence emission spectrum of the emitter material measured normal to its light emitting surface. In other words, the emitter material in free space emits a substantial amount of light in the wavelengths corresponding to the band-edge wavelengths of the photonic crystal. For the sake of simplicity this is referred to as the emitter material emits light into the band-gap, or into the band-edge modes of the photonic crystal.

A particularly advantageous aspect of the disclosed devices is that the location of the emitter layer within the device need not be as precise as is the case with the defect-mode devices.

Figure 5:
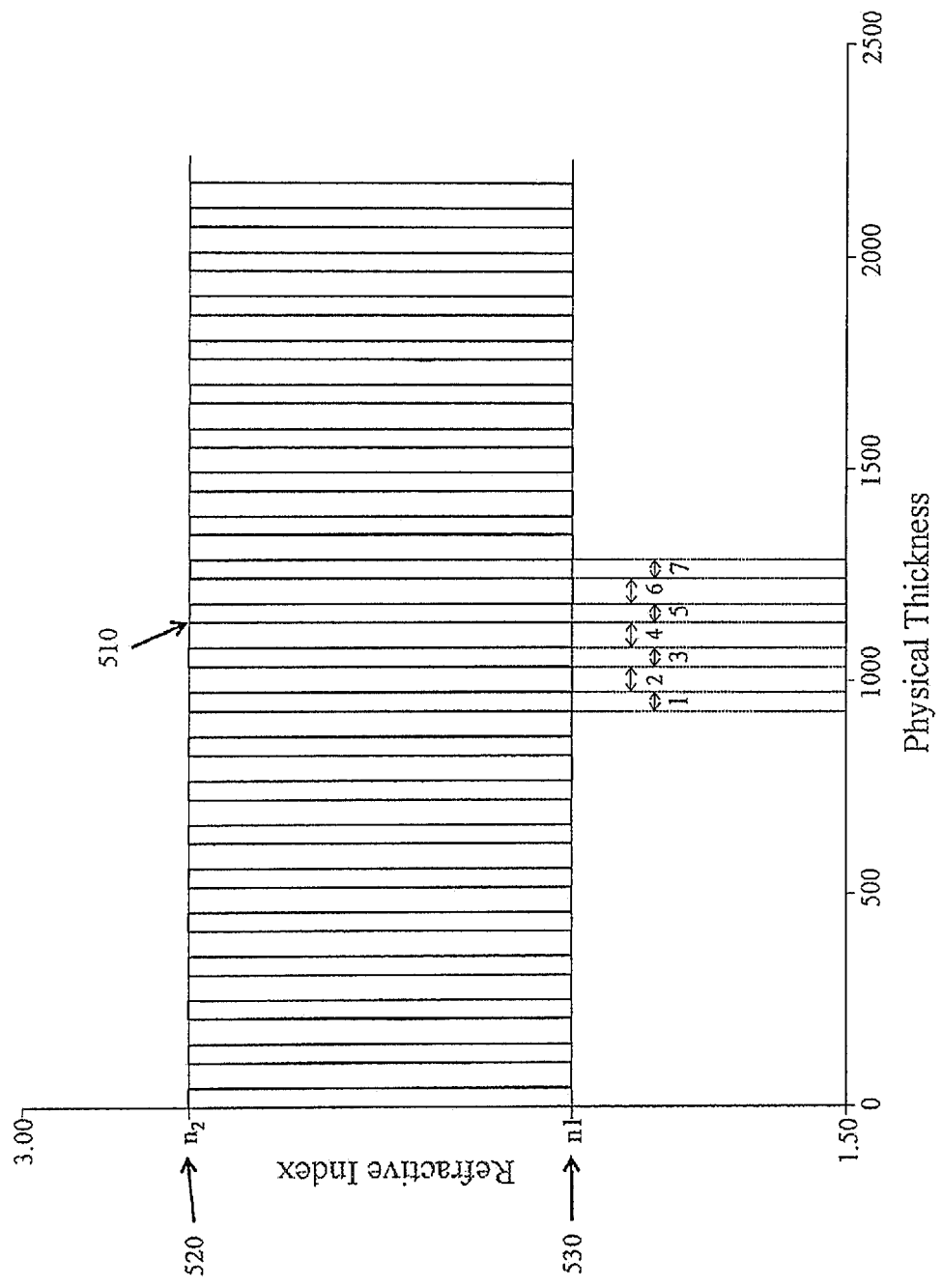
FIG. 5 illustrates the index of refraction profile of a model band-edge emitting photonic structure device.
Figure 6:
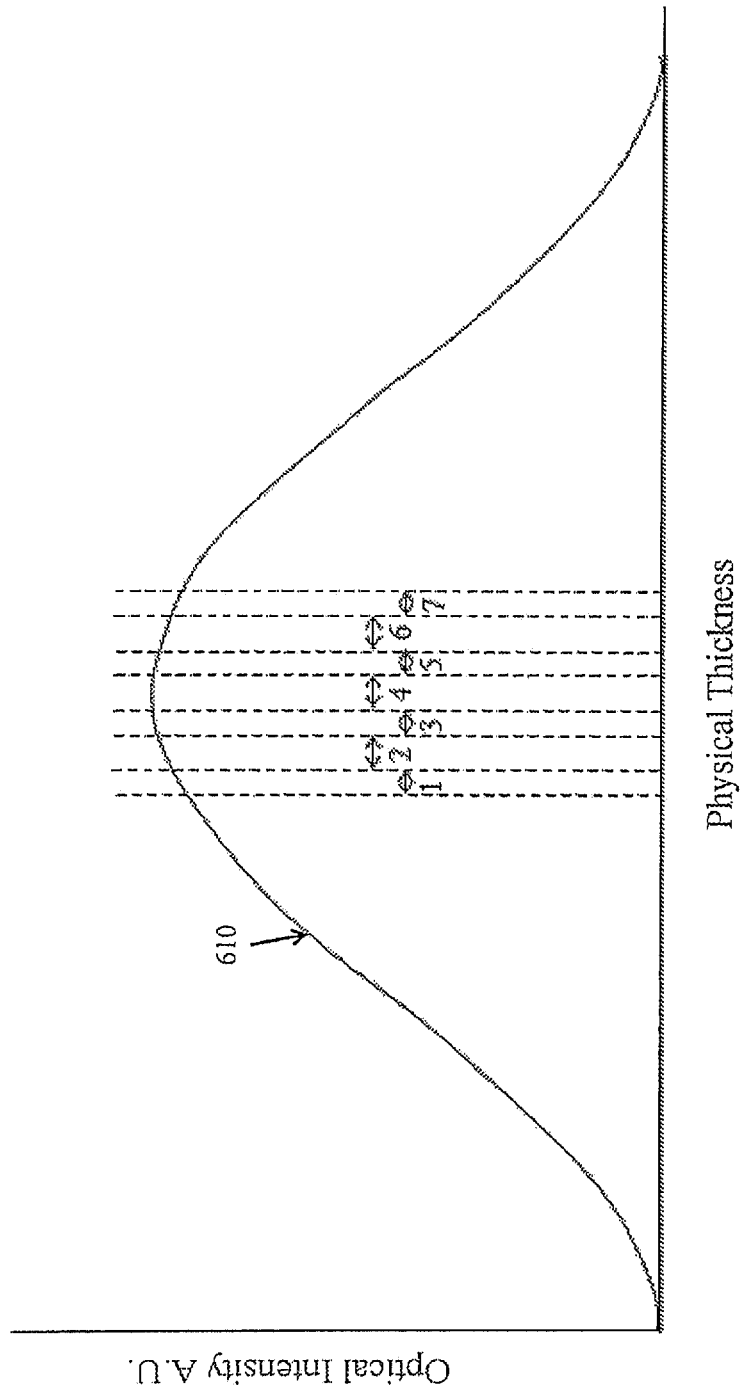
FIG. 6 illustrates the optical intensity of the light distributed through a band-edge emitting photonic structure device.

In the following discussion, compare FIGS. 2 & 3 with FIGS. 5 & 6. The refractive index profile 510 of a simplified computer model of a disclosed BE-OLED device is shown in FIG. 5. The device (not shown) described in this example consists of 43 layers or zones with alternating high ($n_2$) 520 and low ($n_1$) 530 refractive indices. (This number of layers is for exemplary purposes only and is not necessarily an optimum number of device layers.) Zone 4 corresponds to a layer containing light emitting material. Given this structure, when light is emitted from the emitter in zone 4 into band edge light propagation modes that exist within the photonic crystal structure, the distribution of light intensity 610 within the device is that shown in FIG. 6. This distribution occurs because a very large number of modes exist and they not only have multiple wavelengths, but also have different phase relationships relative to the device layer boundaries for any particular emitted wavelength. This is in contrast to the FE-OLED devices described by FIG. 2 and FIG. 3 wherein there is a single light propagation mode and a sharply peaked light intensity distribution at the center of the central layer or zone. When zones 1 through 7, including zone 4 of FIG. 5 are projected onto the light intensity distribution 610 in FIG. 6, it can be seen that the emitter layer could be located anywhere in zone 4 or, for that matter, in zones 2 through 6 with little impact on device performance, because there is little difference in light intensity in any of these regions 2 through 6.

Figure 7:
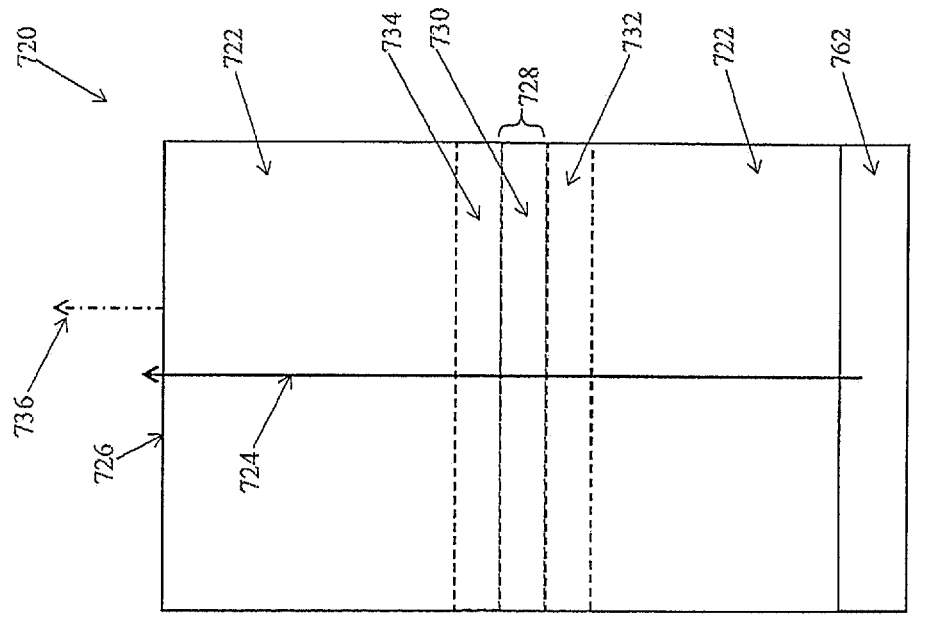
FIG. 7 illustrates various embodiments of the present invention along with an associated refractive index profile of the various embodiments described.
Figure 7:
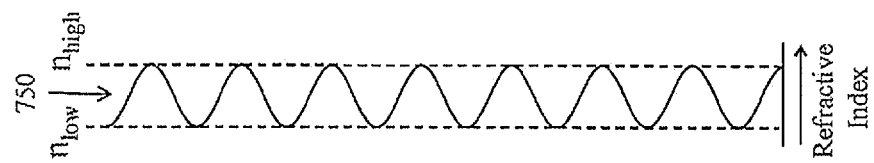
Figure 7:
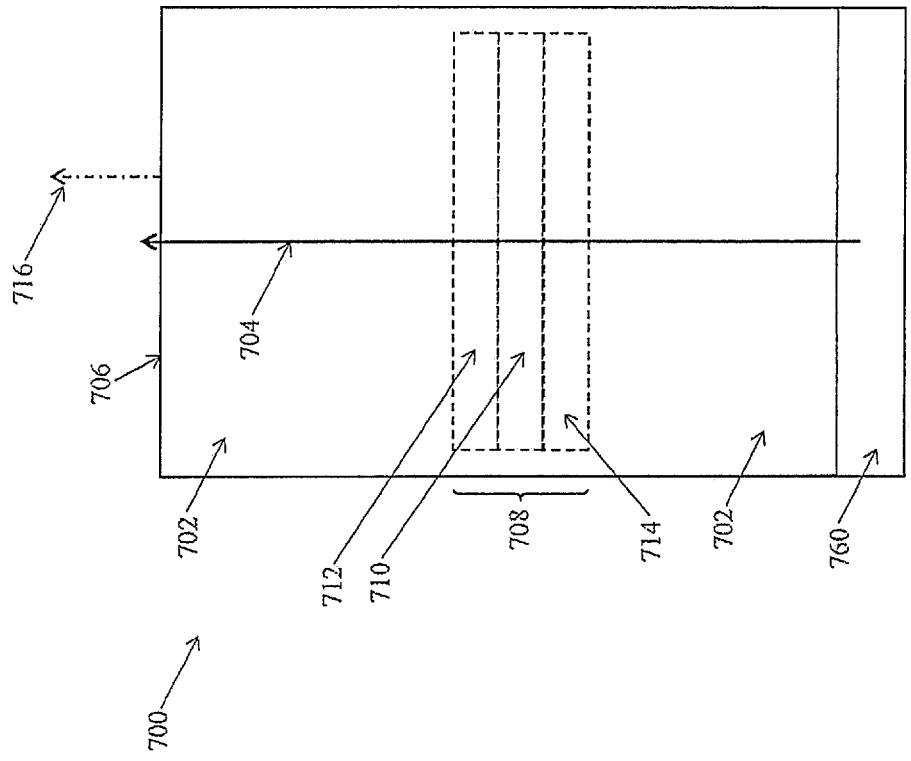

FIG. 7 illustrates cross-sections of various embodiments disclosed of the light emitting device 700. Light emitting device 700 comprises a photonic crystal structure 702 which includes active zone 708 comprising layers 710, 712, 714 (indicated by the dotted lines), a non-limiting example of which is a DBR, (not illustrated); a transmission axis 704; an emission surface 706; and an active zone 708. Active zone 708 is disposed or formed within photonic crystal structure 702 and further comprises an organic layer 710, an anode 712, and a cathode 714. The organic layer further comprises a sublayer comprising an organic electroluminescent material (not shown) and a sublayer comprising a charge transporting material (not shown). The organic layer 710 may further comprise one or more additional sublayers (not shown) comprising charge carrier transport layers, charge carrier injection layers, charge carrier blocking layers, thus it will be appreciated the organic layer 710 may contain one or more additional OLED functional layers. It will be appreciated that layers 710, 712 and 714 together comprise an OLED. As will be appreciated anode 712 and cathode 714 may each be a single electrode or alternatively may further comprise multiple layers of electrodes (not pictured). Active zone 708 is formed such that the periodically varying index of refraction 750 along transmission axis 704 of the photonic structure is not disrupted, or is substantially not disrupted.

Preferably, the organic layer 710 has a maximum optical thickness of approximately ¼ of a single wavelength corresponding the central wavelength prohibited within the photonic structure by the stop-band created by the periodic index of refraction 750 (here the periodic index of refraction is illustrated as a sinusoid, alternatively it may be closer to or substantially a square wave, or some other substantially periodically varying index of refraction). If an optical thickness of ¼ wavelength is impractical for a particular embodiment, the optical thickness of the organic layer 710 may be equal to approximately ¾ of the central wavelength of the stop-band. For example, the optical thickness of each of layers 710, 712, and 714 is approximately ¼ of the central wavelength of the stop-band. When activated by a potential applied across anode 712 and cathode 714 the organic emitter molecules are excited and photons are emitted into the band-edge modes of the photonic crystal. As a result, visible light 716 is emitted from the emission surface 706 at wavelengths corresponding to the band-edge emissions, for example in the bands 406 or 408 of FIG. 4. Preferably, the molecules of the organic emitter material within the organic layer 710 are spatially oriented to maximize stimulated emission parallel to the transmission axis 704. As will be appreciated, when properly formed, the devices 700 being of a photonic structure having a stop-band, the density of states spectrum and transmissivity spectrum of device 700 will be similar to those illustrated in FIG. 4.

In various embodiments the active zone 708 comprises an organic layer 710 that has a refractive index that is lower than that of the anode layer 712 and cathode layer 714, and the anode layer and cathode layer refractive indexes are higher than the adjacent portions of the photonic structure. In various embodiments the anode and the cathode may be adjacent to opposite sides of the organic layer 710 and each may have thickness equivalent to ¼ wavelength of the central wavelength of the stopband, and the organic layer 710, comprising a sub-layer of light emitting material, may have thickness equivalent to ¼ wavelength of the central wavelength of the stop-band and has a refractive index that is lower than that of the anode layer and cathode layer.

FIG. 7 also illustrates various other embodiments of a disclosed light emitting device 720. Similarly to device 700, device 720 comprises a photonic crystal structure 722, which includes layers 732, 728, and 734 (indicated by the dotted lines), a non-limiting example of which is, for instance a DBR; a transmission axis 724; an emission surface 726; and an active zone 728. Active zone 728 is disposed or formed within photonic structure 722 and further comprises an organic layer 730. Photonic structure 720 additionally includes two additional active zones 732 and 734, each may have thickness equivalent to ¼ wavelength of the central wavelength, respectively comprising an anode layer 732, and a cathode layer 734. Organic layer 730 comprises an organic emitter material. Organic layer 730 may further comprise additional OLED functional layers such as charge carrier layers and charge injection layers (not shown). Organic layer 730 may also comprise one or more very thin metallic layers, for example a first 0.5 nm cathode layer (not illustrated) formed from a 50:50 mixture of samarium and silver, or a very thin charge injection layer, as these layers may be formed of materials having relatively low index of refraction. As will be appreciated anode 732 and cathode 734 may also each be a single electrode or alternatively may further comprise multiple layers of electrodes (not pictured). It will be appreciated that one or more OLED functional layers may be located within the anode layer 732 or cathode layer 734 depending on their respective index of refraction. Active zone 728 is formed such that the periodically varying index of refraction 750 along transmission axis 724 of the photonic structure is not disrupted. Preferably, the active zone 728 has a thickness of approximately ¼ of a single wavelength corresponding to the central mode prohibited within the photonic structure due to the stop-band created by the periodic index of refraction 750. One physical difference between 700 and 720 is that the active zone 728 extends planarly throughout two dimensions (i.e. horizontally across the cross section shown in FIG. 7 and into the page of FIG. 7) of the photonic structure, whereas active zone 708 is entirely enclosed by the photonic structure (represented by the dotted lines of 708 not extending to the boundary of device 700). It will be thus appreciated that the active zones need not be layers, but more generally instead may be a zone confined to a small region of the horizontal extent of the photonic crystal. Preferably, the zone containing the organic emitter material may be confined, or localized, within a region comprising less than 10% of the optical thickness of the entire photonic crystal in the vertical direction. It will be appreciated that the active zone may be smaller or larger than the preferable thickness. It will be appreciated that the emitter material may be localized to a single layer comprising 10% or less of the vertical thickness of the photonic crystal 720.

In various disclosed embodiments the light emitting device 720 may be a photonic crystal comprising eleven or more vacuum deposited layers. These eleven layers may first be four or more layers of dielectric materials having alternating indexes of refraction of a pattern low-high-low-high-low-high, then a fifth layer comprising an anode, a sixth layer comprising an organic emitter material (or an OLED minus electrodes), a seventh layer comprising a cathode and finally four or more additional layers of dielectric materials having alternating indexes of refraction of a pattern high-low-high-low-high-low, wherein each layer has substantially the same optical thickness. In various disclosed embodiments, the fifth, sixth and seventh layers comprising an OLED may further comprise various sublayers such as a hole injection layer, a hole transport layer, an emitter layer, an electron transport layer, and an electron injection layer. In other embodiments the first four layers may be replaced by six or perhaps eight vacuum deposited layers with alternating high and low indices of refraction, or the final four layers may be replaced by six or perhaps eight vacuum deposited layers with alternating high and low indices of refraction. It will be appreciated that additional layers of alternating high and low indices of refraction layers may be incorporated without deviating from the invention. In various disclosed embodiments, the exemplary device, e.g. 720, may be formed on a substrate 762, which may comprise a dielectric material such as e.g. glass or plastic.

Various aspects of the devices disclosed herein may be formed using sputtering techniques, or vacuum evaporation techniques, or other similar techniques as will be appreciated by one of skill in the art. Devices may also be formed using a combination of these techniques. In various embodiments, a band-edge type enhanced OLED, may have either of the structures shown in FIG. 7. It is noted that the examples illustrated in FIG. 7 are not drawn to scale. It is also noted that in this example embodiment, thicknesses are approximate such that, e.g. 159 nm, is preferably 159 nm, but may vary slightly given the limitations of the technologies used to form the constituent layers of the following example. Minor variations do not significantly impact performance because the device is forgiving—another improvement over cavity type devices (e.g. FE-OLEDs) which are far more sensitive to variations. Non-limiting examples the structure of photonic crystal 720 may be formed according to the following exemplary embodiments.

In one preferred embodiment, photonic structure 722 may comprise a photonic crystal. To form photonic structure 722, for example two successive pairs of layers of dielectric material having alternating high and low (relative to each other) index of refraction, each layer having 159 nm optical thickness, may be formed on transparent substrate 762. Each pair may comprise a high index layer comprising $TiO_2$ and a low index layer which may comprise $SiO_2$. Non-limiting examples of alternative low index layers may be formed of $LiF$, or $MgF_2$. A non-limiting example of an alternative high index layer may be formed of $Nb_2O_5$. The high index layer in such a case would be formed adjacent to, or on, the substrate 762, which comprising a dielectric material such as glass or plastic will have a relatively low index of refraction. The low index layer would then be formed adjacent to the high index layer. Each pair will be formed upon the previous pair such that the high index layer is formed adjacent to, or upon, the low index layer, thus for example upon substrate 762, photonic crystal 722 may be formed first sputtering one 71.7 nm layer of $TiO_2$ (optical thickness of 159 nm based on a measured refractive index of 2.218) then sputtering one 108.8 nm layer of $SiO_2$ (optical thickness of 159 nm based on a measured refractive index of 1.462), and repeating these steps two more times, such that this intermediate result comprises an uppermost layer having a low index of refraction.

Upon this intermediate result may be formed anode 732, for example anode 732 may be a transparent inorganic semiconductor anode comprising a 79.2 nm thick layer of $In_2O_3ZnO$ (indium-zinc oxide, IZO, 90:10) (optical thickness of 159 nm based on a measured refractive index of 2.008). Alternatively $In_2O_3$—$SnO_2$ (indium tin oxide, ITO) may be substituted for IZO. A ternary oxide such as gallium-indium-tin oxide may be used in devices meant to emit blue light since this material can have better transmissivity for blue light than the alternatives. Upon this anode 732 may be formed an active layer 728 having an optical thickness of 159 nm comprising, for example, the various organic materials and low refractive index material constituting the OLED (minus its electrodes), such that the index of refraction of active layer 728 is lower than the index of refraction of the anode 732.

Continuing the example immediately above, active zone 728 may be formed for example by thermal evaporation of the various constituent sub-layers, which may comprise a layer of N,N'-Bis(naphthalen-1-yl)-N,N'-bis(phenyl)-benzidine (NPB) (for instance, 31.8 nm in physical thickness equivalent to an optical thickness of 65.6 nm based on a measured refractive index of 1.831) which material functions as a hole transporting material and a layer of tris-(8-hydroxyquinoline) aluminum (Alq3) (for instance, 47.8 nm in physical thickness equivalent to an optical thickness of 92.3 nm based on a measured refractive index of 1.724) which material functions as both an electron transporting and an emissive material. Therefore the active zone 728 of photonic structure 722 contains organic layer 730. The two constraints on active zone 728 in this exemplary embodiment are that it have an optical thickness of approximately 159 nm, and the index of refraction of the constituent layers are each respectively lower than the index of refraction of the anode layer 732. One or more additional functional (for instance, metal and electron injection layers of the cathode) or non-functional layers may act as spacers if necessary to achieve the necessary thickness of active zone 728. Upon completion of this intermediate result, the photonic structure 722 comprises a substrate having a relatively low index of refraction, three alternating pairs of alternating dielectric layers of respectively high and low index of refraction, an anode layer having a high index of refraction and an active zone having a low index of refraction, where each layer of the intermediate result is approximately 159 nm in optical thickness. Optionally an electron injection layer of lithium fluoride (not illustrated) 0.5 nm in physical thickness (optical thickness of 0.6 nm based on a refractive index of 1.294) may be formed by vacuum thermal evaporation may be formed upon the Alq3 layer. This thin, relatively low refractive index layer have an optical thickness totaling 0.6 nm.

Continuing the example immediately above, a first 0.5 nm cathode layer (not illustrated) formed from a 50:50 mixture of samarium and silver by vacuum thermal evaporation may be deposited on top of the lithium fluoride. This layer has an optical thickness of 0.5 nm and therefore has a negligible effect on the refractive index profile of the photonic crystal, and may be accounted for as part of the active layer 728 or the second cathode layer 734 A second cathode layer, for example 734, may be formed upon the first cathode layer. The second cathode layer 734 has an optical thickness of approximately 159 nm thick may be fabricated from sputtered IZO or another transparent conductive oxide. The second cathode layer 734 has a relatively high index of refraction when compared with the materials comprising the active zone 728, as well as having a high index of refraction when compared with $SiO_2$, or its alternatives.

Upon the cathode layer two successive pairs of layers of dielectric material having alternating low and high index of refractions may be formed, each layer approximately 150 nm thick. Each pair may comprise a low index layer which may comprise $SiO_2$, and a high index layer comprising $TiO_2$. As described above, non-limiting examples of alternative low index layers may be formed of LiF, or $MgF_2$. A non-limiting example of an alternative high index layer may be formed of $Nb_2O_5$. The low index layer in such a case would be formed adjacent to, or on top of, the cathode layer 734, which will have a relatively high index of refraction. Each pair will be formed upon the previous pair such that the high index layer is formed adjacent to, or upon, the low index layer, thus for example upon cathode layer 734, photonic crystal 722 may continue to be formed by sputtering one 159 nm layer of $SiO_2$ then sputtering one 159 nm layer of $Nb_2O_5$, and repeating this one more time, such that this final result comprises a single photonic crystal 722 having an uppermost layer having a high index of refraction. It will be appreciated that the emitter material within the photonic crystal is confined to a region that is less than 10% of the overall optical thickness of the device.

In another alternative exemplary embodiment, exemplary photonic crystal, e.g. 720, may instead be formed as follows. Beginning with transparent substrate 762 comprising glass or plastic. As with the embodiment described above, three successive pairs of layers of dielectric material having alternating high and low (relative to each other) index of refraction, each layer 147.5 nm in optical thickness may be formed on the substrate. Each pair may comprise a high index layer comprising $Nb_2O_5$ and a low index layer which may comprise Sift. Non-limiting examples of alternative low index layers may be formed of LiF, or $MgF_2$. A non-limiting example of alternative high index layers may be formed of $TiO_2$. The high index layer in such a case may be formed adjacent to the substrate, which comprising glass or plastic will have a relatively low index of refraction. Each pair will be formed upon the previous pair such that the high index layer is formed adjacent to, or upon, the low index layer, thus for example upon substrate 762, photonic crystal 722 may be formed first sputtering one 82.2 nm layer of $Nb_2O_5$ (optical thickness of 147.5 nm based on a measured refractive index of 1.795) then sputtering one 101.2 nm layer of $SiO_2$ (optical thickness of 147.5 nm based on a measured refractive index of 1.457), and repeating this two more times, such that this intermediate result comprises an uppermost layer having a low index of refraction.

As in the previous embodiment described above, upon this intermediate result may be formed anode 732, for example anode 732 may be a transparent inorganic semiconductor anode comprising a 73.5 nm thick layer of $In_2O_3$—ZnO (indium-zinc oxide, IZO) (optical thickness of 147.5 nm based on a measured refractive index of 2.008). Alternatively the anode 732 may comprise a layer of optical thickness 147.5 nm comprising approximately 10% $ZnO_2$ and 90% $In_2O_3$. Upon this anode 732 may be formed an active layer 728 having a total optical thickness of 147.5 nm comprising, for example, the various organic and other low refractive index materials constituting the OLED, such that the index of refraction of active layer 728 is lower than the index of refraction of the anode 732.

Continuing the example immediately above, active zone 728 may be formed for example by thermal evaporation of the various constituent layers, which in this case may comprise (preferably in the following order): a thermally evaporated layer of copper phthalocyanine (CuPC) 2.0 nm in thickness (2.6 nm in optical thickness based on a refractive index of 1.318), or alternatively dipyrazino[2,3-f:2',3'-h]quinoxaline-2,3,6,7,10,11-hexacarbonitrile (HAT-CN), which functions as a hole injection layer; followed by a 35.0 nm thick thermally evaporated layer of 4,4'-Bis(9-carbazolyl)-1,1'-biphenyl (CBP) (64.4 nm in optical thickness based on a refractive index of 1.840) which material functions as a hole transporting material; a 15.0 nm thick layer of thermally evaporated CBP doped with 8% bis[2-(2-pyridinyl-N)phenyl-C] (acetylacetonato)iridium(III) (Ir $(ppy)_2(acac)$) (27.5 nm in optical thickness based on a refractive index of 1.831) which material functions as the emissive material; a 29.3 nm thick layer of 2,2',2"-(1,3,5-benzinetriyl-tris(1-phenyl-1-H-benzimidazol (TPBi) (50.8 nm in optical thickness based on a refractive index of 1.736) which functions as an electron transport layer; and a 1.0 nm layer of 8-hydroxyquinolatolithium (Liq) (1.7 nm in optical thickness based on a refractive index of 1.7), which functions as an electron injection layer. Therefore the active zone 728 contains organic layer 730. The two constraints on active zone 728 in this exemplary embodiment are that it have a thickness of approximately 147.5 nm, and the index of refraction of the constituent layers are each respectively lower than the index of refraction of the anode layer 732. One or more additional functional (for instance, metal and electron injection layers of the cathode) or non-functional layers may act as spacers if necessary to achieve the necessary thickness of active zone 728. Upon completion of this intermediate result, the photonic crystal 722 comprises a substrate having a relatively low index of refraction, three alternating pairs of alternating dielectric layers of respectively high and low index of refraction, an anode layer having a high index of refraction and an active zone having a low index of refraction, where each layer of the intermediate result is approximately 147.5 nm in thickness. Additionally, the hole injection layer and hole transport layers, respectively comprising CuPC and CBP in this example may be substituted with one layer of N,N'-Bis-(1naphthalenyl)-N,N'-bis-phenyl-(1,1'-biphenyl)-4,4'-diamine (NBP), which is a hole transport material having electron blocking properties.

Continuing the example immediately above, a first 0.5 nm cathode layer (not illustrated) formed from a 50:50 mixture of samarium and silver by vacuum thermal evaporation may be deposited on top of the 8-hydroxyquinolatolithium. This layer has an optical thickness of 0.5 nm. A second cathode layer, for example 734, may be formed upon the first cathode layer. The second cathode layer 732 has an optical thickness of approximately 147.5 nm thick may be fabricated from sputtered IZO or another transparent conductive oxide. The second cathode layer 734 has a relatively high index of refraction when compared with the materials comprising the active zone 728, as well as having a high index of refraction when compared with $SiO_2$, or its alternatives.

Upon the cathode layer three successive pairs of layers of dielectric material having alternating low and high index of refractions may be deposited, each with an optical thickness of approximately 147.5 nm. Each pair may comprise a low index layer which may comprise $SiO_2$, and a high index layer comprising $Nb_2O_5$. As described above, non-limiting examples of alternative low index layers may be formed of quartz, LiF, or MgF$_2$. A non-limiting example of an alternative high index layer may be formed of TiO$_2$. The low index layer in such a case may be formed adjacent to, or on top of, the cathode layer 734, which will have a relatively high index of refraction. Each pair will be formed upon the previous pair such that the high index layer is formed adjacent to, or upon, the low index layer, thus for example upon cathode layer 734, photonic crystal 722 may continue by sputtering one approximately 147.5 nm layer of SiO$_2$ then sputtering one approximately 147.5 nm layer of Nb$_2$O$_5$, and repeating this two more times, such that this final result comprises a single photonic crystal 722 an uppermost layer having a high index of refraction.

In another alternative exemplary embodiment, exemplary photonic crystal, e.g. 720, may instead be formed as follows. Beginning with transparent substrate 762 comprising glass or plastic. Two successive pairs of layers of dielectric material having alternating high and low (relative to each other) index of refraction, each layer 162 nm in optical thickness may be formed on the substrate. Each pair may comprise a high index layer comprising TiO$_2$ and a low index layer which may comprise SiO$_2$. Non-limiting examples of alternative low index layers may be formed of LiF, or MgF$_2$. A non-limiting example of alternative high index layers may be formed of Nb$_2$O$_5$. The high index layer in such a case may be formed adjacent to the substrate, which comprising glass or plastic will have a relatively low index of refraction. Each pair will be formed upon the previous pair such that the high index layer is formed adjacent to, or upon, the low index layer, thus for example upon substrate 762, photonic crystal 722 may be formed first sputtering one 73.4 nm layer of TiO$_2$ (optical thickness of 162 nm based on a measured refractive index of 2.206) then sputtering one 110.7 nm layer of SiO$_2$ (optical thickness of 162 nm based on a measured refractive index of 1.463), and repeating this one more time, such that this intermediate result comprises an uppermost layer having a low index of refraction.

As in the previous embodiment described above, upon this intermediate result may be formed anode 732, for example anode 732 may be a transparent inorganic semiconductor anode comprising a 82.4 nm thick layer of In$_2$O$_3$—ZnO (indium-zinc oxide, IZO) (optical thickness of 162 nm based on a measured refractive index of 1.966). Alternatively the anode 732 may comprise a layer of optical thickness 162 nm comprising approximately 10% ZnO$_2$ and 90% In$_2$O$_3$. Upon this anode 732 may be formed an active layer 728 having a total optical thickness of 162 nm comprising, for example, the various organic and other low refractive index materials constituting the OLED, such that the index of refraction of active layer 728 is lower than the index of refraction of the anode 732.

Continuing the example immediately above, active zone 728 may be formed for example by thermal evaporation of the various constituent layers, which in this case may comprise: a thermally evaporated layer of N,N'-Bis(32aphthalene-1-yl)-N,N'-bis(phenyl)-benzidine (NPB) (for instance, 20 nm in physical thickness equivalent to an optical thickness of 35 nm based on a measured refractive index of 1.748) which functions as a hole injection and transporting layer; followed by a 5.0 nm thick thermally evaporated layer of 4,4',4"-tri(N-carbazoyl)triphenylamine (TcTa) (9.0 nm in optical thickness based on a refractive index of 1.807) which material functions as a triplet blocking material; a 15.0 nm thick layer of thermally evaporated 9-(3-(3,5-di(pyridine-2-yl)-1H-1,2,4-triazol-1-yl)phenyl-9H-carbazole (m-CBTZ) doped with 10% bis(2-phenylbenzothiazolato)(acetylacetonato)iridium (III) (Ir(bt)$_2$(acac)) (29.0 nm in optical thickness based on a refractive index of 1.935) which material functions as the emissive material; a 51.4 nm thick layer of TPBi (87.8 nm in optical thickness based on a refractive index of 1.708) which functions as an electron transport layer; and a 0.5 nm layer of lithium fluoride (0.7 nm in optical thickness based on a refractive index of 1.391), which functions as an electron injection layer. Therefore the active zone 728 contains organic layer 730. The two constraints on active zone 728 in this exemplary embodiment are that it have a thickness of approximately 162 nm, and the index of refraction of the constituent layers are each respectively lower than the index of refraction of the anode layer 732. One or more additional functional (for instance, metal and electron injection layers of the cathode) or non-functional layers may act as spacers if necessary to achieve the necessary thickness of active zone 728. Upon completion of this intermediate result, the photonic crystal 722 comprises a substrate having a relatively low index of refraction, two alternating pairs of alternating dielectric layers of respectively high and low index of refraction, an anode layer having a high index of refraction and an active zone having a low index of refraction, where each layer of the intermediate result is approximately 162 nm in thickness.

Continuing the example immediately above, a first 0.5 nm cathode layer (not illustrated) formed from a 50:50 mixture of samarium and silver by vacuum thermal evaporation may be deposited on top of the lithium fluoride. This layer has an optical thickness of 0.5 nm. A second cathode layer, for example 734, may be formed upon the first cathode layer. The second cathode layer 732 has an optical thickness of approximately 162 nm thick may be fabricated from sputtered IZO or another transparent conductive oxide. The second cathode layer 734 has a relatively high index of refraction when compared with the materials comprising the active zone 728, as well as having a high index of refraction when compared with SiO$_2$, or its alternatives.

Upon the cathode layer three successive pairs of layers of dielectric material having alternating low and high index of refractions may be deposited, each with an optical thickness of approximately 162 nm. Each pair may comprise a low index layer which may comprise SiO$_2$, and a high index layer comprising TiO$_2$. As described above, non-limiting examples of alternative low index layers may be formed of LiF, or MgF$_2$. A non-limiting example of an alternative high index layer may be formed of Nb$_2$O$_5$. The low index layer in such a case may be formed adjacent to, or on top of, the cathode layer 734, which will have a relatively high index of refraction. Each pair will be formed upon the previous pair such that the high index layer is formed adjacent to, or upon, the low index layer, thus for example upon cathode layer 734, photonic crystal 722 may continue by sputtering one approximately 162 nm layer of SiO$_2$ then sputtering one approximately 162 nm layer of Nb$_2$O$_5$, and repeating this two more times, such that this final result comprises a single photonic crystal 722 an uppermost layer having a high index of refraction.

In the exemplary embodiments disclosed above, one of skill in the art will appreciate that light will be emitted from each "end", or surface 726, of the photonic crystal, 722, and approximately parallel to the transmission axis 736. To configure the device to emit from only one end, a mirror or reflector needs to be placed on one end. When metallic mirrors are used allowance should be made for the phase shift that occurs upon reflection from a metallic surface, for example, by increasing the thickness of the adjacent layer. Alternatively it will be within the skill of one skilled in the art, to simply increasing the number of high-index/low-index dielectric pairs at one end of the device until no light or very little light is emitted from that respective end.

One of skill in the art will appreciate that small changes in the phase of light caused by the metallic cathode, various layer boundaries, and unknown or uncontrollable variations in the indices of refraction may require tuning of the thicknesses in various components. These variations will occur on a determinate basis, and therefore given the chosen materials one can tune the thicknesses of one or more layers, such as a layer of TBP, to correct for these minor variations. Additionally, when sputtering ITO and IZO, variations in the index of refraction will occur in these materials, which can also be accounted for by tuning the physical thickness in order to achieve the correct optical thickness.

The light that is emitted from the photonic crystal structures of the inventive devices propagates in the direction normal to plane of the device (parallel to the transmission axis 704). The electric vectors associated with this light are therefore all oriented parallel to the plane of the device. This means that this light will only stimulate emission from those excited state molecules having transition moments with components substantially in the plane of the device. Energy that is used to excite molecules whose transition moments are substantially perpendicular to the plane of the device may therefore is lost to in-plane light emission or non-radiative relaxation mechanisms. For this reason, host-dopant mixtures in which an anisotropic host preferentially aligns the transition moments of the emissive dopants in the plane of the device are preferred. An example is CBP doped with $Ir(ppy)_2(acac)$.

Figure 8:
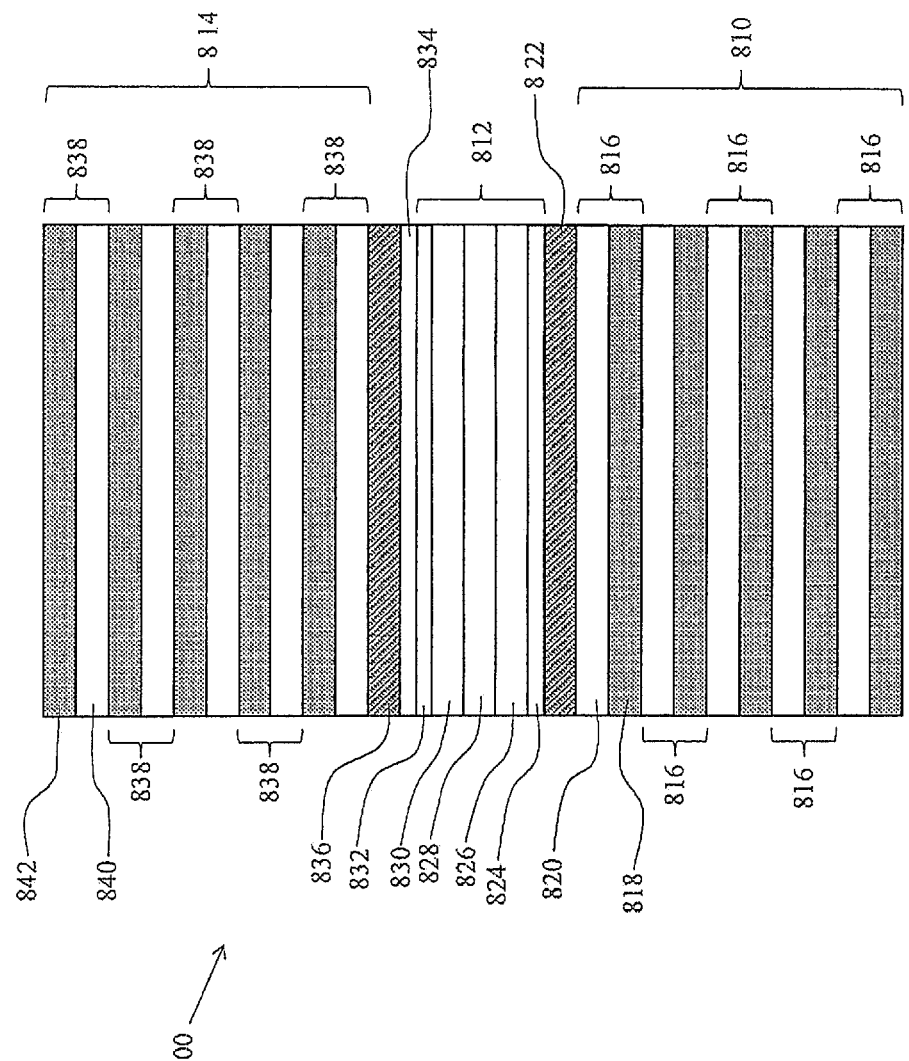
FIG. 8 illustrates various embodiments of the present invention.

One of skill in the art will also appreciate that various other aspects may have different layer compositions. Various additional embodiments of a disclosed device 800 are portrayed in FIG. 8. The shown embodiments may comprise a photonic crystal having a band-gap, and be formed of alternating high index of refraction dielectric materials and low index of refraction dielectric materials capable of producing a periodically varying refractive index, and an OLED containing an emitter material whose free space electroluminescence emission yields a significantly high radiance at the band-edge wavelengths, that is to say, a radiance that when measured normal to the device surface is preferably at least 25% and most preferably at least 50% of the radiance at the peak spectral electroluminescence for the material. In other words, the measured radiance of luminescence light emitted by the light emitting material utilized in the organic light emitting diode is greater than one-quarter of the peak radiance of the luminescence emission spectrum of the emitter material measured normal to its light emitting surface. The device comprises three sub-structures: a first portion of the photonic crystal structure 810, a central low refractive index zone 812, and a second portion of the photonic crystal structure 814. The references to "a portion" are meant as convention to ease the description the components of 800 which is formed to be a single unitary photonic crystal. Aside from these three sub-structures the devices described by FIG. 8 may also comprise a transparent anode 822, a thin first cathode layer 834 composed of a low work function metal, and a second transparent cathode layer 836. The transparent anode 822 may be fabricated from any suitable transparent conductive material such as indium-tin oxide or indium-zinc oxide. The first cathode layer may be fabricated from thin, transparent film of any suitable low work function metal, for instance aluminum, a magnesium/ silver alloy, silver/rare earth alloy or a pure rare earth metal such as samarium or ytterbium. The second cathode layer 836 may be fabricated from any suitable transparent conductive material such as indium-tin oxide. A second metal layer may also optionally be inserted between layers 834 and 836, for instance, if the materials in 834 and 836 are not compatible with each other.

The first portion of the photonic crystal structure 810 may comprise multiple (in this non-limiting example five, but can be more or less) layer pairs 816. Each of the layer pairs is comprised of a layer 818 of a transparent high refractive index material and a layer 820 of a transparent low refractive index material. Each of the layers that comprise the layer pairs 816 have an optical thickness equal to one-quarter of the central wavelength of the stop-band of the photonic crystal sub-structure 810. Optical thickness being equal to the physical thickness of the layer times the refractive index of the layer. The second portion of the photonic crystal structure 814 may comprise multiple (in this non-limiting example five, but can be more or less) layer pairs 838. Each of the layer pairs may comprise a layer 840 of a transparent low refractive index material and a layer 842 of a transparent high refractive index material. Each of the layers that comprise the layer pairs 838 may have an optical thickness equal to about one-quarter of the central wavelength of the stop-band of the photonic crystal sub-structure 814 which is in turn equal to that of photonic crystal sub-structure 810.

The central low refractive index zone 812 may comprise a hole injection layer 824, a hole transporting layer 826, an emitter layer 828, an electron transporting layer 830, and an electron injection layer 832. All of the layers contained in the central low refractive index zone 812 have refractive indices lower than those of electrodes 822 and 836 and the total optical thickness of all the layers contained in zone 812 is equal to one-quarter of the central wavelength of the stopbands of the photonic crystal sub-structure 810 and 814. In various embodiments they emitter layer 828 comprises an emitter material having a emission spectrum and an absorption spectrum, and the band-gap is tailored (by altering the optical thickness of each layer of the device, or more generally by altering the physical length of the spatial period of the periodic refractive index profile) such that the peak radiance wavelength of the band-edge light emission at the band-edge of the band-gap and measured normal to the device surface is a wavelength at which free space light emission of the emitter material is preferably greater than ¼ and most preferably greater than ½ the peak radiance of the emitter. The emitter material whose free space electroluminescence emission yields a significantly high radiance at the band-edge wavelengths, that is to say, a radiance that is preferably at least 25% and most preferably at least 50% of the radiance at the peak spectral electroluminescence for the material.

Electrode layers 822 and 836 may have refractive indices that are not only higher than the materials in the central low refractive index zone 812, but they may also have refractive indices that are higher than adjacent layers 820 and 840 respectively. Electrode layers 822 and 836 may also have optical thickness equal to one-quarter of the central wavelength of the stop-band of the photonic crystal sub-structure 814 and 816. Cathode layer 834 may be extremely thin and generally has a negligible effect on the optical thickness of cathode 836, but should be counted as part of either central low index zone 812 or cathode layer 836 (which ever of the two its index is closer to) in terms of optical design. In this way the sequence of layers 820, 822, 812 (composite layer), 836, and 840 may yield the low/high/low/high/low alternation of refractive indices required for inclusion in a photonic crystal. Thus it can be seen that sub-structures 810, 812, 814 and layers 822 and 836 all may as a unitary combination form a single photonic crystal structure 800.

When device 800 is electrically activated, holes flow from anode 822 through hole injection layer 824 and hole transporting layer 826 into emitter layer 828. At the same time electrons flow from cathode layers 834 and 836 through electron injection layer 832 and electron transporting layer 830 into emitter layer 828. The electrons and holes recombine on luminescent material molecules in layer 828 yielding excitons. Since emitter layer 828 may be inside a photonic crystal structure, excitons created in that layer cannot emit light at wavelengths in the stop-band of the photonic crystal. However, where the emission band of the luminescent material in layer 828 overlaps the band-edge wavelengths of the stop-band, light emission does occur and because of the high density of states at those wavelengths unusually high levels of emission occur. The photonic crystal traps the light from band-edge emission within its structure increasing the photon density to the point where there are sufficient photons interacting with excitons that nearly all light emission is stimulated emission. There is, however, by design and usually because of the nature of the materials involved insufficient laser gain in the organic materials to support lasing at current levels achievable in these devices. Since the light from stimulated emission is almost completely vertical in its direction of propagation within the device, there is very little loss due to internal reflection and trapping of light and the device is as a result highly energy efficient.

The nature and number of the layers comprising central low refractive index zone 812 may be altered so long as there is a emitter layer present that may be electrically activated to emit light and as long as the emission spectrum of that emitter material contain wavelengths that overlap the stop-band of the photonic crystal. For instance, the functions of hole injection layer 824 and hole transporting layer may be combined into a separate single layer. The functions of electron injection layer 832 and electron transporting layer 830 may be combined into a separate single layer. Additional hole transporting or electron transporting as well as hole blocking, electron blocking, and triplet blocking layers may be introduced.

The photonic crystal structures in device 800 may be built up a layer at a time as are the functional OLED layers of the device. Thus the photonic crystal structures may have a discontinuous periodic refractive index profile.

In some cases the proper electrical functioning of the device 800 may require that the total thickness of central low refractive index zone 812 be greater than one-quarter the desired central wavelength of the stop-band of the photonic crystal 800. For instance, this issue may, but not necessarily, occur in devices that are designed to produce blue or violet light, or any other color. If this is the case, the thickness of central low refractive index zone 812 may total three quarters of the central wavelength of the stop-bands of the photonic crystal sub-structures 810 and 814 in optical thickness. One will appreciate that the number of alternating layers can be more or less than those described in FIG. 8, and that the optimum number of layers may differ depending on the application.

Figure 9:
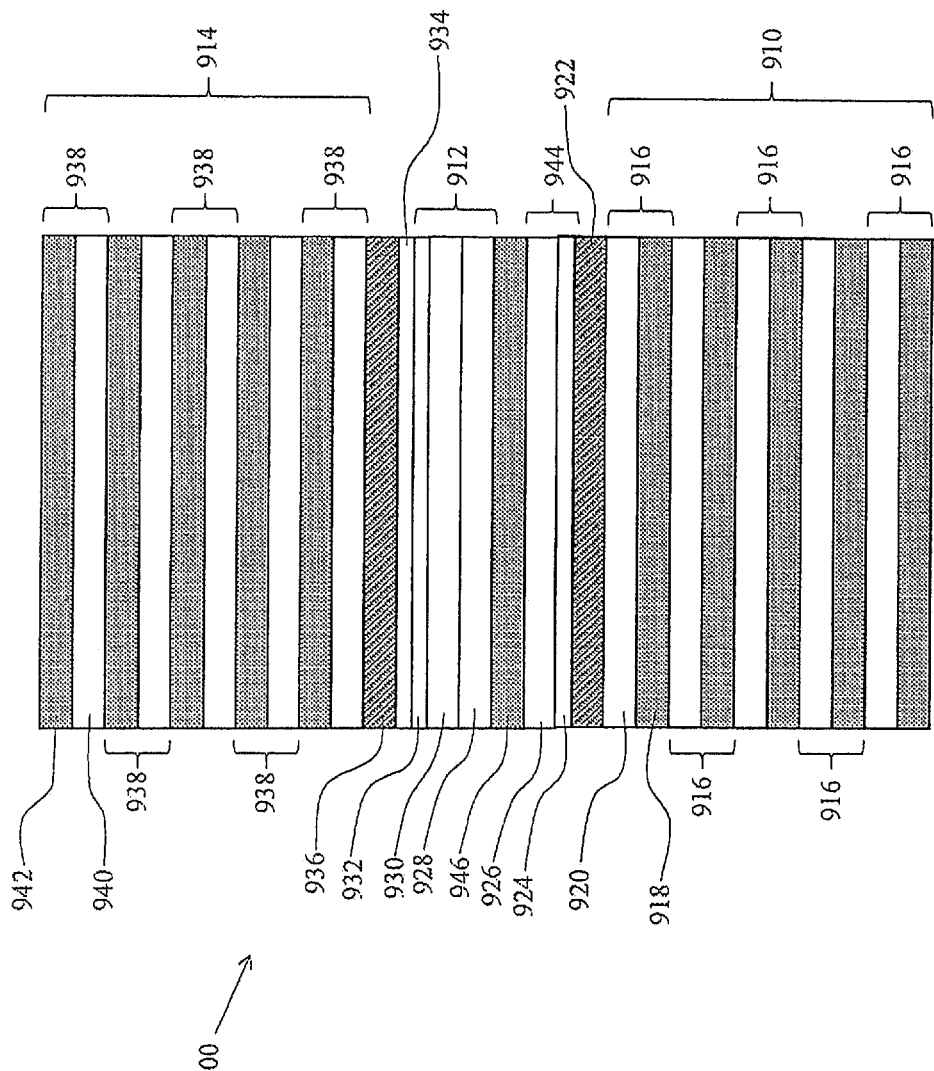
FIG. 9 illustrates various embodiments of the present invention.

Increasing the thickness of zone 812 to three-quarters of the central stop-band wavelength may not be the best solution for blue or violet emitting devices. Instead an alternative solution is the altered design 900 as shown in FIG. 9. Device 900 is quite similar to device 800 in that there is a first portion of the photonic crystal structure 910, a central low refractive index zone 912, and a second portion of the photonic crystal structure 914 with these three sub-structures corresponding to sub-structures 810, 812, and 814 in device 800. The difference here is that central low refractive index zone 912 comprises only emitter layer 928, electron transporting layer 930, and electron injection layer 932. Hole injection layer 924 combines with hole transporting layer 926 to compose another low refractive index zone 944. This low refractive index zone is separated from the central low refractive index zone 912 by a second hole transporting layer 946. The material in the hole transporting layer 946 has a higher refractive index than the materials in zones 944 and 912. The combined optical thickness of the layers that compose zone 912 is equal to one-quarter of the central wavelength of the stop-bands of the photonic crystal sub-structures 910 and 914. The combined optical thickness of the two layers that compose zone 944 is equal to one-quarter of the central wavelength of the stop-bands of the photonic crystal sub-structures 910 and 914, and the optical thickness of layer 946, of anode 922, and of cathode layer 936 are each equal to one-quarter of the central wavelength of the stopbands of the photonic crystal sub-structures 910 and 914. Thus it can be seen that first portion of the photonic crystal structure 910, the low refractive index zone 944, the central low refractive index zone 912, and the second portion of the photonic crystal structure 914 combine with layers 922, 946, and 936 to create a single photonic crystal structure. This structure interacts with light emitted by emitter layer 928 in the same manner as described for device 800 above.

Figure 10:
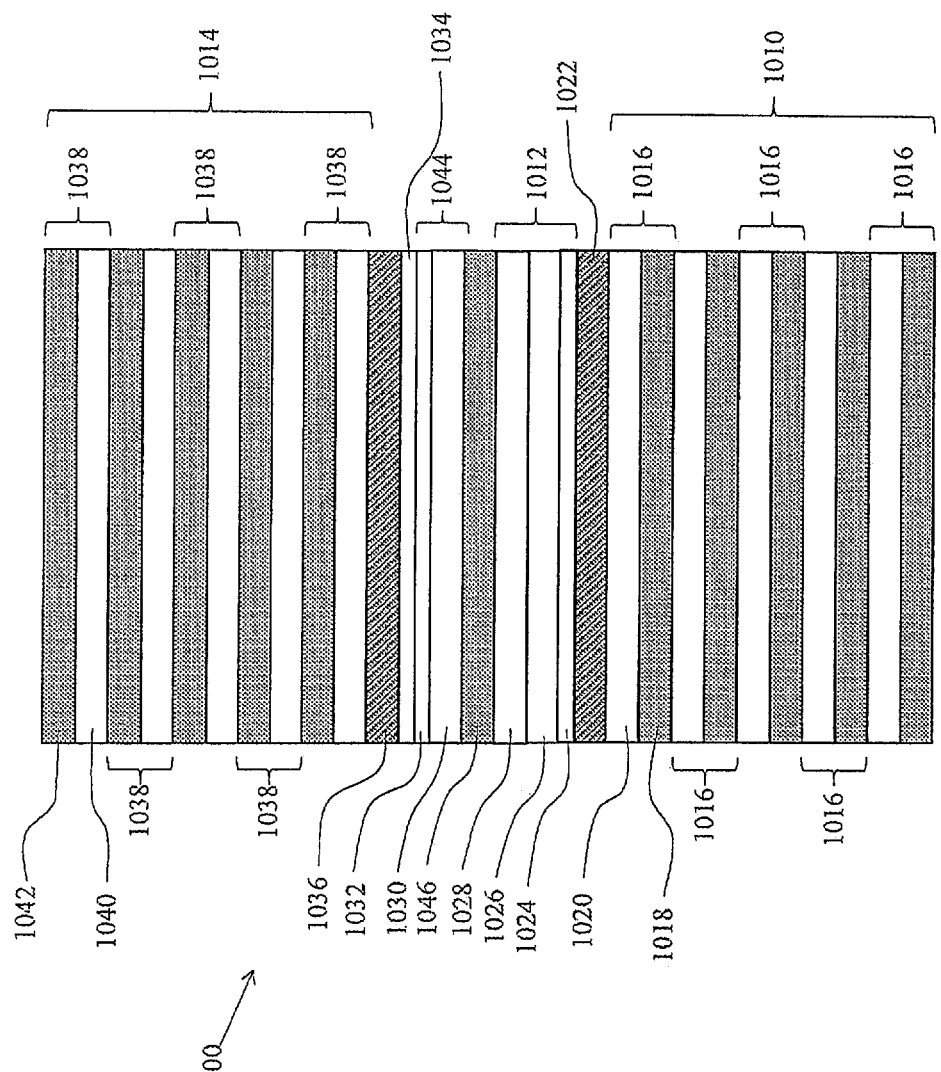
FIG. 10 illustrates various embodiments of the present invention.

Additional alternative embodiments are illustrated by device 1000 that also may solve the potential issues inherent with generating short wavelength light is shown in FIG. 10. This device has a first portion of the photonic crystal structure 1010, a central low refractive index zone 1012, and a second portion of the photonic crystal structure 1014 with these three structures corresponding to structures 810, 812, and 814 in device 800. The difference in this device is that central low refractive index zone 1012 comprises only emitter layer 1028, hole transporting layer 930, and hole injection layer 1032. Electron injection layer 1024 combines with electron transporting layer 1026 to compose another low refractive index zone 1044. This low refractive index zone is separated from the central low refractive index zone 1012 by a second electron transporting layer 1046. The material in electron transporting layer 1046 has a higher refractive index than the materials in zones 1044 and 1012. The combined optical thickness of the layers that compose zone 1012 is equal to one-quarter of the central wavelength of the stop-bands of the photonic crystal sub-structures 1010 and 1014. The combined optical thickness of the two layers that compose zone 1044 is equal to one-quarter of the central wavelength of the stop-bands of the photonic crystal substructures 1010 and 1014, and the optical thickness of layer 1046, of anode 1022, and of cathode layer 1036 are each equal to one-quarter of the central wavelength of the stopbands of the photonic crystal sub-structures 1010 and 1014. Thus it can be seen that the first portion of the photonic crystal structure 1010, low refractive index zone 1044, central low refractive index zone 1012, and the second portion of the photonic crystal structure 1014 combine with layers 1022, 1046, and 1036 to create a single photonic crystal structure. This structure interacts with light emitted by emitter layer 1028 in the same manner as described for device 800 above.

Devices such as 800, 900, and 1000 are unlike known devices because they are incapable of producing laser light, have no micro-cavity in which light generation occurs, utilize stop-band edge stimulated emission, and have photonic crystals with discontinuous refractive index profiles. At the present time this may be the only combination of device properties that enables the production of commercially feasible OLED devices with very high energy efficiency.

Figure 11:
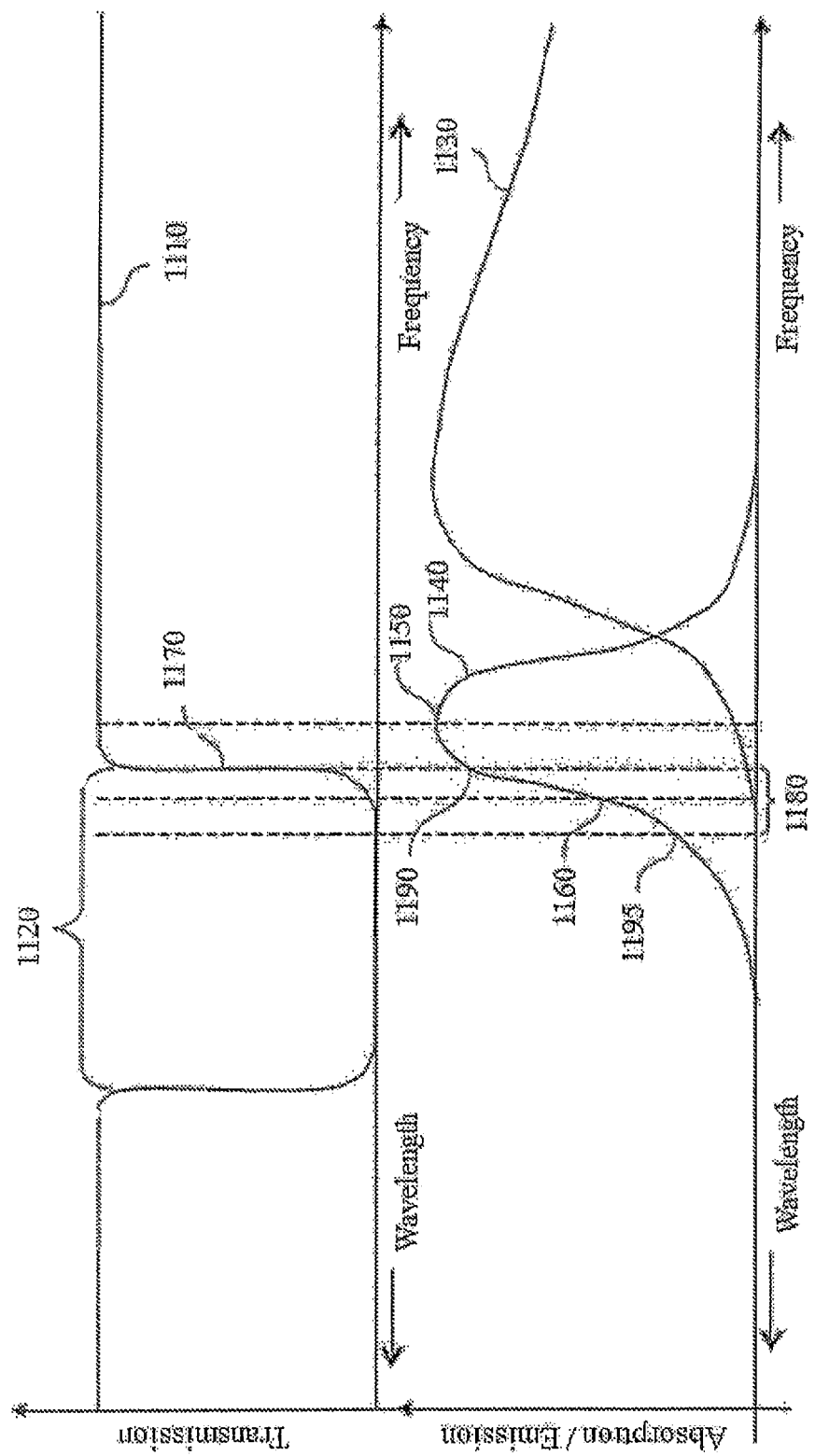
FIG. 11 illustrates design considerations of a band-edge emitting photonic structure device.

FIG. 11 illustrates how to choose a combination of emitter material and band-gap material. Illustrated is an exemplary transmission spectrum 1110 of a photonic crystal having a band-gap 1120. Also illustrated are the absorption spectrum 1130 and the emission spectrum 1140 of an exemplary emitter material. As is shown the emission spectrum has a peak power, 1150 occurring at $\lambda_{PP}$, a half peak power 1160 occurring at $\lambda_{1/2PP}$, and a one-quarter peak power 1195 occurring at $\lambda_{1/4PP}$. Preferably, to achieve a high efficiency device, the photonic crystal is configured such that an edge of the band-gap 1170 falls between the peak emission wavelength 1150 and the ¼ peak emission wavelength 1195, in a region of the spectrum that overlaps areas of the absorption spectrum 1130 as little as possible, in other words, in a region 1180 where there is low absorption by the emitter material. Most preferably the photonic crystal is configured such that an edge of the band-gap 1170 falls between the peak emission wavelength 1150 and the ½ peak emission wavelength 1160, in a region of the spectrum that overlaps areas of the absorption spectrum 1130 as little as possible, in other words, in a region 1180 where there is low absorption by the emitter material. The band-gap edge 1170 may fall on a wavelength at which light absorption for a single pass of light through the emitter layer is less than 1%. Preferably, the band edge 1170 may fall on a wavelength at which light absorption for a single pass of light through the emitter layer is less than ½%, while also corresponding to a wavelength of the emission spectrum that is greater than ¼ peak radiance.

1190. Also, it will be appreciated that the emission spectrum of an emitter material may have more than one peak, and that herein discussions of peak radiance are relative to the region in the spectrum nearby to the band-gap. It will be appreciated that the output light of the disclosed device is determined based on the wavelengths corresponding the band-edge, such that the output spectrum of the device can be tailored by adjusting the layer thicknesses and thus the band-edge wavelengths. Because a first photonic crystal having a stop-band corresponding to one wavelength may be transparent, or substantially transparent to a second photonic crystal having a stop-band that is shifted up or down in the transmission spectrum from the first photonic crystal, a single device capable of emitting band-edge light corresponding to two or more stop-bands may be formed by stacking one or more photonic crystals atop each other.

Often, emitter material molecules in OLED devices have shapes that favor light emission in some directions relative to molecular orientation over others. Because of this, by uniformly aligning the molecules of the emitter material in an emitter layer in a specific orientation, light will be emitted more intensely in some directions relative to the plane of the emitter layer than in others. This is because the molecular orbitals in these molecules may be asymmetric in shape and in terms of their electronic polarizability. Interaction with incident light or emission of light will be strongest when the electric vector of the light lies along the direction of highest electrical polarizability within an orbital. However, since light emission or absorption involves two molecular orbitals, that of the excited and that of the electronic ground state, and since quite often the directions of highest electrical polarizability are different for these two orbitals, the light electric vector direction yielding the highest interaction or emission is intermediate between the directions of highest electron polarizability for the two orbitals. The light electric vector direction that yields the highest interaction is termed the transition moment (or transition dipole moment) since it is the direction of the transient electric dipole induced in the molecule by interaction with the light (or conversely by the direction the transient electric dipole that emits the light). Thus it can be seen that if the emitter molecules are uniformly aligned such that their transition moments are perpendicular to the propagation direction of the feedback light, the efficiency of the interaction between emitter materials and the feedback light is maximized thereby producing maximum stimulated emission. This sort of alignment can be achieved by utilizing rigid anisotropic emitter molecules of the right geometry dissolved in host materials that have rigid rod or disk-shaped molecules that "lay down" on the underlying layer surface thus yielding and anisotropic environment that, in turn, aligns the emitter molecules. Host materials that may exhibit this behavior are 4,4'-bis(carbazol-9-yl)biphenyl (CBP) and N,N'-bis(naphthalene-1-yl)N, N'-bis(phenyl)benzidine (NPB).

Some iridium III organometallic phosphorescent emitter materials may have their molecules spontaneously aligned by some host materials so as to have their transition moments for the desired phosphorescent emission predominantly aligned in the plane of the OLED emissive layer. In particular some heteroleptic iridium III complexes with two ligands comprising aromatic substituted nitrogen containing aromatic compounds and third acetoacetonate ligand have displayed this sort of alignment. Examples of this are bis(2phenylpyridine) (acetylacetonate)iridium(III) dopant in a 4,4'-bis(carbazol-9-yl)biphenyl host and bis(2methyldibenzo[f,h]quinoxaline) (acetylacetonate)iridium(III) in N,N'-bis(naphthalene-1-yl)N,N'-bis(phenyl)benzidine.

Anisotropic emitter material formulations such as these can be used advantageously to further increase the energy efficiency of the devices of this invention.

The embodiments described above are illustrative examples and it should not be construed that the present invention is limited to these particular embodiments. For example, although OLED devices were used as examples of emissive devices, other luminescent material or structures may be used, not limited to OLEDs. Further, although refractive index profiles, direction of light, etc. were described as being "normal" to a plane, it should be understood that they need not be exactly normal, rather in a close range of being normal or substantially normal. Accordingly, the embodiments described in this application also may include cases in which they are about normal or substantially normal to a plane. Further, various components and aspects described with reference to different embodiments are interchangeable among different embodiments, and are not limited to one particular embodiment. Thus, various changes and modifications may be effected by one skilled in the art without departing from the spirit or scope of the invention as defined in the appended claims.

While the present invention has been particularly shown and described with reference to example embodiments thereof, it will be understood by those of ordinary skill in the art that various changes in form and details may be made therein without departing from the spirit and scope of the present invention as defined by the following claims and equivalents thereof. It is therefore desired that the present embodiments be considered in all respects as illustrative and not restrictive, reference being made to the appended claims and equivalents thereof rather than the foregoing description to indicate the scope of the invention.

We claim:

1. A single light emitting photonic crystal having a bandgap and organic electroluminescent emitter material disposed within the single photonic crystal, wherein the organic electroluminescent emitter material comprises an organic light emitting material localized in a zone having less than 10% of an optical thickness of the photonic crystal, further wherein the organic electroluminescent emitter material has a free space emission spectrum that at least in part overlaps the band-gap of the photonic crystal, further wherein the photonic crystal emits light at a wavelength corresponding to the edge of the band-gap, further wherein the photonic crystal has a periodically varying refractive index, further wherein the photonic crystal further comprises alternating layers of high index of refraction materials and low index of refraction materials, further wherein one of the layers of low index of refraction materials comprises the organic electroluminescent emitter material, further wherein the layer comprising the organic electroluminescent emitter material further comprises additional organic materials each having a low index of refraction respective to an adjacent layer, wherein the additional organic materials are at least one of a charge transport material, a charge injection material, or a charge blocking material and further wherein the single light emitting photonic crystal is configured to emit light from only one surface.

2. The single light emitting photonic crystal of claim 1 wherein a metallic reflector is formed on a surface opposite the only one surface that emits light.

3. The single light emitting photonic crystal of claim 1 wherein a greater number of alternating layers of high index of refraction materials and low index of refraction materials are disposed upon a first side of the layer of low index of refraction material that comprises the organic electroluminescent emitter material than a lesser number of alternating layers of high index of refraction materials and low index of refraction materials disposed on a second side of the layer of low index of refraction material that comprises the organic electroluminescent emitter material opposite the first side.

* * * * *